(12) United States Patent
Kahn et al.

(10) Patent No.: US 7,981,328 B2
(45) Date of Patent: Jul. 19, 2011

(54) N-TYPE DOPING OF AN ELECTRON TRANSPORT MATERIAL AND METHODS OF USE THEREOF

(75) Inventors: Antoine Kahn, Princeton, NJ (US); Calvin Chan, South Brunswick, NJ (US); Stephen Barlow, Atlanta, GA (US); Seth Marder, Atlanta, GA (US)

(73) Assignees: Georgia Tech Research Corporation, Atlanta, GA (US); The Trustees of Princeton Univeristy, Princeton, NJ (US)

( * ) Notice: Subject to any disclaimer, the term of this patent is extended or adjusted under 35 U.S.C. 154(b) by 589 days.

(21) Appl. No.: 11/766,904

(22) Filed: Jun. 22, 2007

(65) Prior Publication Data
US 2007/0295941 A1 Dec. 27, 2007

Related U.S. Application Data

(60) Provisional application No. 60/815,636, filed on Jun. 22, 2006.

(51) Int. Cl.
| | |
|---|---|
| H01L 27/15 | (2006.01) |
| H01L 31/12 | (2006.01) |
| H01L 33/00 | (2006.01) |
| H01L 27/14 | (2006.01) |
| H01L 31/00 | (2006.01) |

(52) U.S. Cl. .............. 252/519.21; 257/86; 257/431
(58) Field of Classification Search .............. 257/86, 257/103, E33.037, E39.007, E51.012; 252/519.21
See application file for complete search history.

(56) References Cited

U.S. PATENT DOCUMENTS
| | | | | |
|---|---|---|---|---|
| 2003/0003300 A1* | 1/2003 | Korgel et al. | | 428/402 |
| 2006/0155106 A1* | 7/2006 | Roberts et al. | | 528/423 |
| 2006/0210897 A1* | 9/2006 | Jubran et al. | | 430/77 |

FOREIGN PATENT DOCUMENTS
WO   WO2005123737   * 12/2005

OTHER PUBLICATIONS

Barlow, S., et al. "Some Georgia Tech Activities Relevant to Organic Solar Cells." PowerPoint Presentation. Feb. 8, 2007 at the Organic Solar Cell Consortium at the University of Wollongong, New South Wales, Australia.

Chan, C.K., et al. "N-type doping of an electron-transport material by controlled gas-phase incorporation of cobaltocene." Chemical Physics Letters 2006; 431:67-71.

Kahn, A. "N- and p-doping of organic molecular films: improvement of charge carrier injection." PowerPoint Presentation. Jul. 19, 2006 presented at the Weizmann Institute of Science, Rehovt, Israel.

Kahn, A. "N-doping of organic molecular semiconductors: the challenge of reducing law electron affinity materials." PowerPoint Presentation. May 8, 2007 presented at First Solvay-COPE Symposium on Organic Electronics at the Georgia Institute of Technology, Atlanta, GA.

Domrachev et al, "The Structure of Fullerene Films and Their Metal-locene Doping", Russian Chemical Bulletin,1994, vol. 43(8), p. 1305-1309.

* cited by examiner

*Primary Examiner* — William M. Brewster

(57) ABSTRACT

Electron transport material and methods of N-type doping the same are provided.

13 Claims, 8 Drawing Sheets

N-TYPE DOPING OF AN ELECTRON TRANSPORT MATERIAL AND METHODS OF USE THEREOF

This application claims priority under 35 U.S.C. §119(e) to U.S. Provisional Patent Application No. 60/815,636, filed on Jun. 22, 2006. The foregoing application is incorporated by reference herein.

Pursuant to 35 U.S.C. Section 202(c), it is acknowledged that the United States Government has certain rights in the invention described herein, which was made in part with funds from the National Science Foundation Grant No. DMR-0408589.

FIELD OF THE INVENTION

The present invention relates to electron transport material and methods of use thereof. More specifically, the instant invention relates to N-type doping of electron transport material and methods of producing the same.

BACKGROUND OF THE INVENTION

With the rapid advance of organic electronics and optoelectronics such as organic light emitting diodes (OLED), organic field effect transistors (OFETS) and organic photovoltaics (OPV) cells, electrical doping of organic thin films has been recognized as a means to overcome fundamental material properties limiting their electrical performance. Electrical or chemical doping of molecular organic films is an efficient means of improving and controlling charge injection and carrier transport in organic devices. Doping can enhance device efficiency by introducing a space-charge layer that improves charge injection via tunneling and by providing additional free carriers to increase carrier density and mobility. The most commonly used n-dopants in molecular devices are alkali metal atoms (i.e., Li or Cs atoms) that donate an electron to the molecular host (Kido et al. (1998) Appl. Phys. Lett., 73:2866; Parthasarathy et al. (2001) J. Appl. Phys., 89:4986; Yan et al. (2001) Appl. Phys. Lett., 79:4148; Mason et al. (2001) J. Appl. Phys., 89:2756; Le et al. (2000) J. Appl. Phys., 87:375; Ihm et al. (2003) Appl. Phys. Lett., 83:2949; Liu et al. (2004) Appl. Phys. Lett., 85:837). While alkali metals have the appropriately low ionization energy to n-dope practically any organic material (Kido (1998) Appl. Phys. Lett., 73:2866; Gao et al. (2003) Chem. Phys. Lett., 380:451; Ding et al. (2005) Appl. Phys. Lett., 86:213508), these materials present several intrinsic limitations. First, alkali metal atoms have small atomic radii and are prone to diffusion through the organic film. This makes it difficult to produce well-defined space-charge regions, introduces device instability, and causes undesired quenching sites at light-emitting interfaces. Second, the small positive counterion that remains after charge donation (e.g., $Li^+$) lies close to the host molecule and creates a large coulombic trapping potential for the donated electron. Third, this form of n-doping is accompanied by decomposition of the organic transport material (Le et al. (2000) J. Appl. Phys., 87:375). Alkali metals are, therefore, relatively inefficient and undesirable donors in molecular solids.

Molecular doping, that is, electrical doping using molecular compounds, is viewed as a possible solution to the limitations listed above. A bulkier organic molecule would reduce or eliminate dopant diffusion and larger organic-organic molecular distance would minimize the trapping of donated carriers by the ionized dopants. Although p-type molecular doping (e.g., with fluorinated tetracyanoquinodimethane ($F_4$-TCNQ)) has been investigated and applied (Blochwitz et al. (2001) Org. Elect., 2:97; Gao et al. (2002) Org. Elect., 3:53; Gao et al. (2003) J. Appl. Phys., 94:359; Gao et al. (2003) J. Phys. Condens. Matter, 15:S2757-S2770; Chan et al. (2004) J. Vac. Sci. Tech. A, 22:1488), the energetic requirements for molecular n-type doping have hindered the identification and development of suitable electron donor/acceptor pairs. Since the electron affinity (EA) of most organic electron transport materials is smaller in magnitude than ~4 eV (Kahn et al. (2003) Polym. Phys., 41:2529), the ionization energy (IE) of an efficient organic n-type dopant needs to be equally small. However, such materials are easily oxidized and generally unstable under ambient conditions. Indeed, the synthesis, handling, and delivery of larger organic dopants with sufficiently low ionization energy (IE) for efficient electron transfer to most host materials of interest, have proven very difficult and impractical (Nollau et al. (2000) J. Appl. Phys., 87:4340; Wang et al. (2006) Chem. Phys. Lett., 423:170; Werner et al. (2003) Appl. Phys. Lett., 82:4495; Werner et al. (2004) Adv. Funct. Mater., 14:255; Chan (2006) Adv. Funct. Mater., 16:831). For example, the organic salt precursor pyronin B chloride was found to decompose under thermal evaporation to produce a neutral radical capable of n-doping a material like 1,4,5,8-naphthalene tetracarboxylic dianhydride (NTCDA) (Werner et al. (2003) Appl. Phys. Lett., 82:4495; Werner et al. (2004) Adv. Funct. Mater., 14:255; Chan et al. (2006) Adv. Funct. Mater., 16:831). However, this type of compound is relatively difficult to use and the complex chemical and physical interactions with the host ultimately limit their utility in electronic devices (Chan et al. (2006) Adv. Funct. Mater., 16:831).

SUMMARY OF THE INVENTION

The present invention broadly relates to conductive material (e.g., a conductor or semiconductor) comprising an organic electron transporting material and at least one organometallic compound. In a particular embodiment, the free energy change associated with electron transfer from the organometallic compound to the organic electron transporting material is less than +0.3 eV. In another embodiment of the instant invention, the organometallic compound has a formula selected from the group consisting of Formulas I-X. The instant invention also encompasses electronic devices comprising the conductive material.

In yet another aspect of the instant invention, methods of synthesizing the conductive material are provided. The method may comprise bringing the organic electron transporting material and the organometallic compound into proximity (e.g., contacting) such that electron transfer can occur between them and growing the organic electron transporting material, either sequentially or concurrently with the first step. In a particular embodiment, the synthesis method comprises growing the organic electron transporting material under a partial pressure of the organometallic compound. The partial pressure of the organometallic compound can be modulated to effect the concentration of the organometallic compound in the resultant conductive material.

BRIEF DESCRIPTIONS OF THE DRAWING

FIG. 1 provides graphs of the ultraviolet photoemission spectroscopy (UPS; He I) and inverse photoemission spectroscopy (IPES) spectra of pristine $CoCp_2$ (top) and THAP (HATNA-70; bottom) films grown on Pt and PEDOT:PSS substrates, respectively. The full and dashed vertical lines represent the vacuum level and the onsets to occupied and unoccupied states, respectively. Insets: chemical structure of $COCp_2$ (top) and THAP (HATNA-70; bottom).

Figure 4:
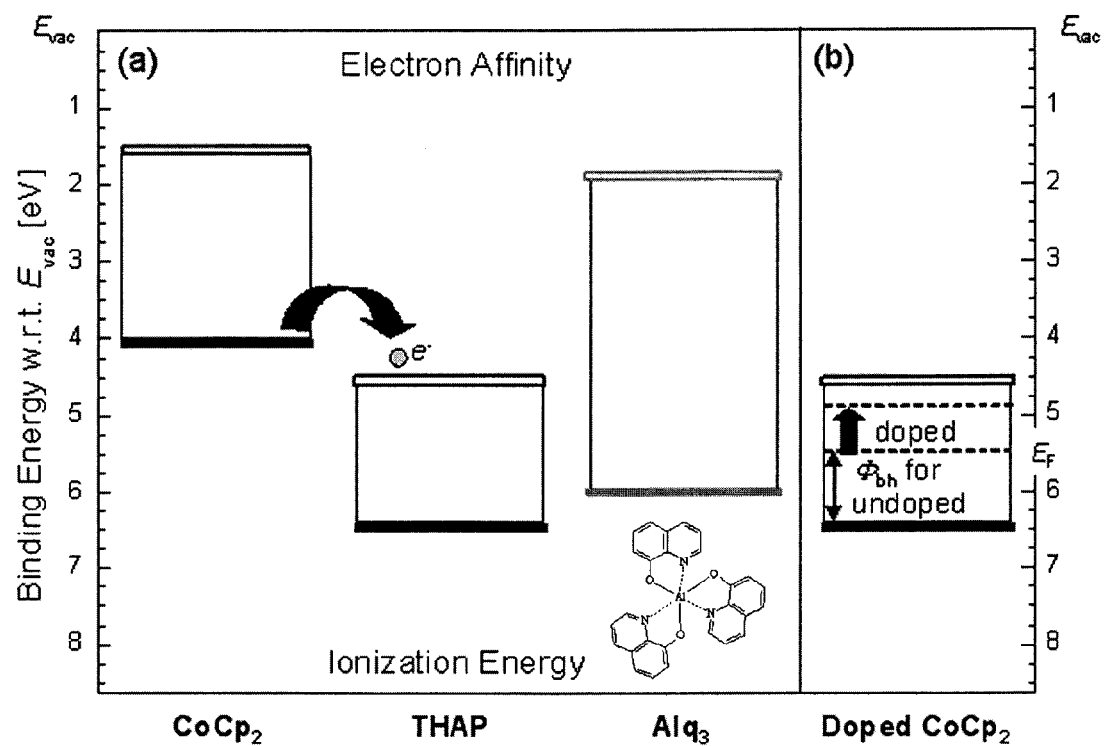

FIG. 4A is a schematic diagram illustrating the energetically favorable electron transfer from the HOMO of cobaltocene to the LUMO of THAP and the large energy difference between the dopant HOMO and the $Alq_3$ LUMO. FIG. 4B is a schematic diagram illustrating the effect of this doping on the EF position in a THAP film. The molecular structure of $Alq_3$ is shown in the inset.

Figure 5:
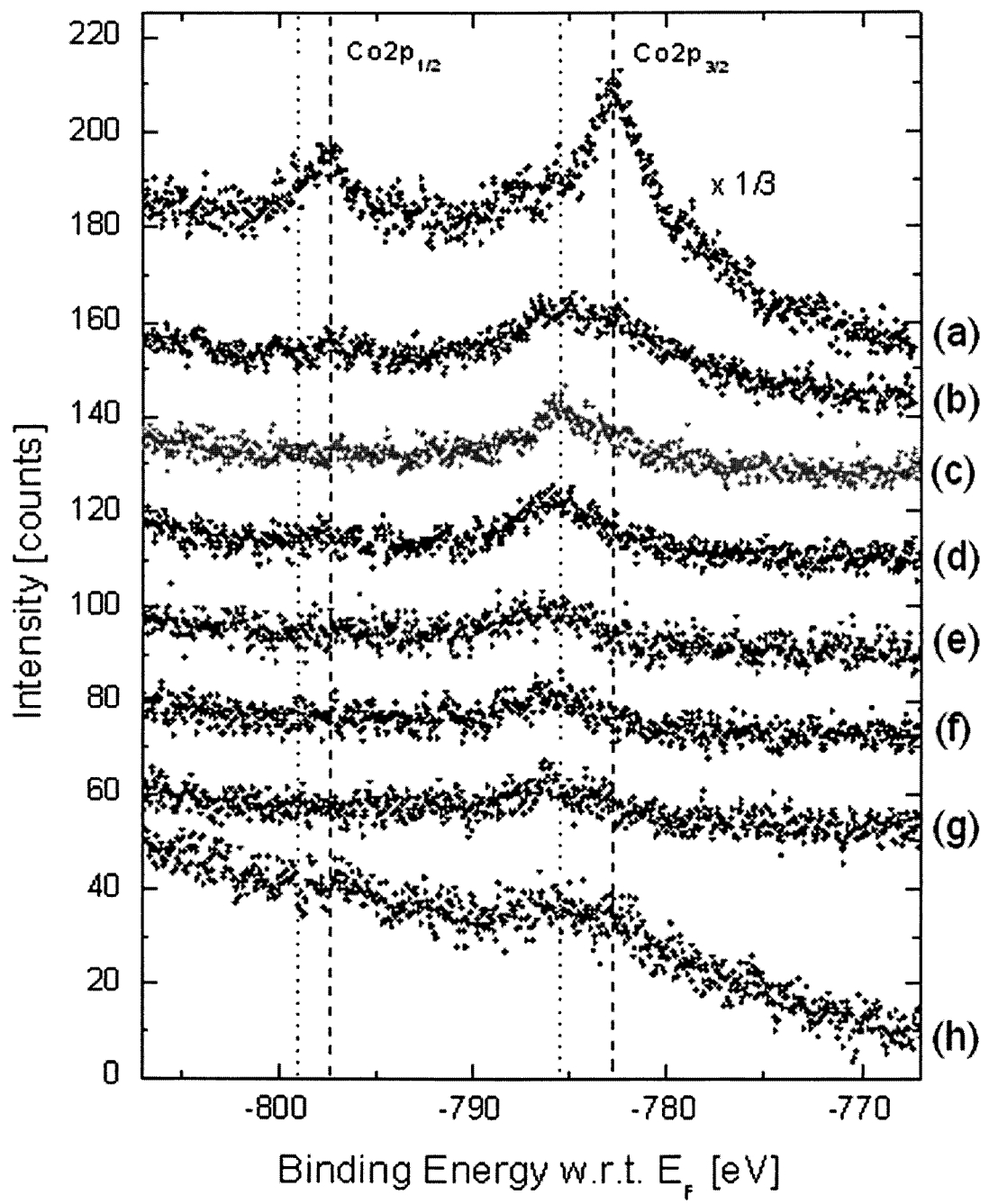

FIG. 5 is a graph of Co 2p core levels measured by XPS on (a) a pure cobaltocene film on Pt; 6 nm of THAP deposited on PEDOT:PSS under a cobaltocene partial pressure of (b) $p_d=10^{-7}$ Torr, (c) $p_d=5\times10^{-8}$ Torr, and (d) $p_d=5\times10^{-9}$ Torr; (e) an interface-doped sample consisting of 5 nm of doped THAP ($p_d=10^{-7}$ Torr) underneath 20 nm of pristine THAP; sample (e) annealed at (f) 50° C. for 30 minutes, and (g) 60° C. for an additional 1 hour; and (h) an undoped layer of THAP with the surface exposed to $p_d=10^{-7}$ Torr of cobaltocene for 5 minutes.

Figure 6:
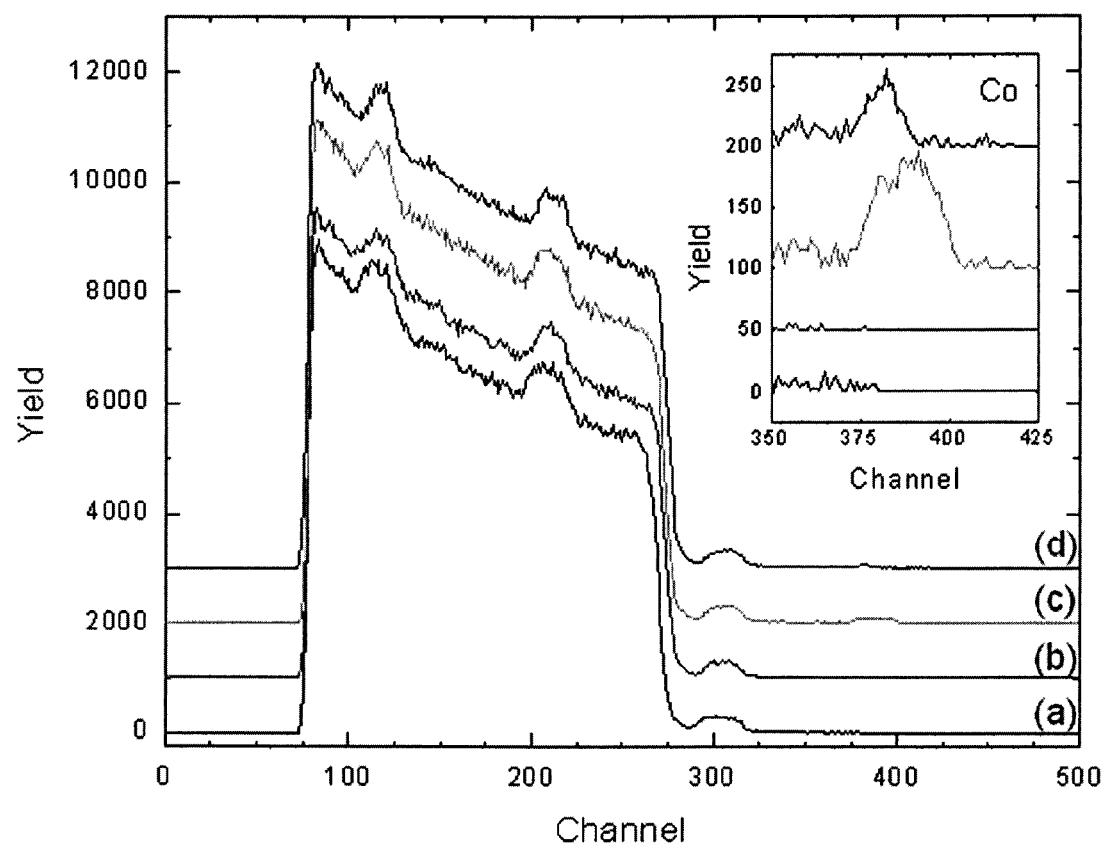

FIG. 6 is a graph of RBS spectra of various samples of THAP: (a) 100 nm of undoped THAP deposited on Si(100); 100 nm of THAP deposited in a cobaltocene partial pressure of (b) $p_d=10^{-9}$ Torr, and (c) $p_d=10^{-7}$ Torr; (d) 30 nm of doped THAP ($p_d=10^{-7}$ Torr) underneath a 70 nm layer of pristine THAP. The channel (energy) range corresponding to the Co signal is expanded in the inset.

Figure 7:
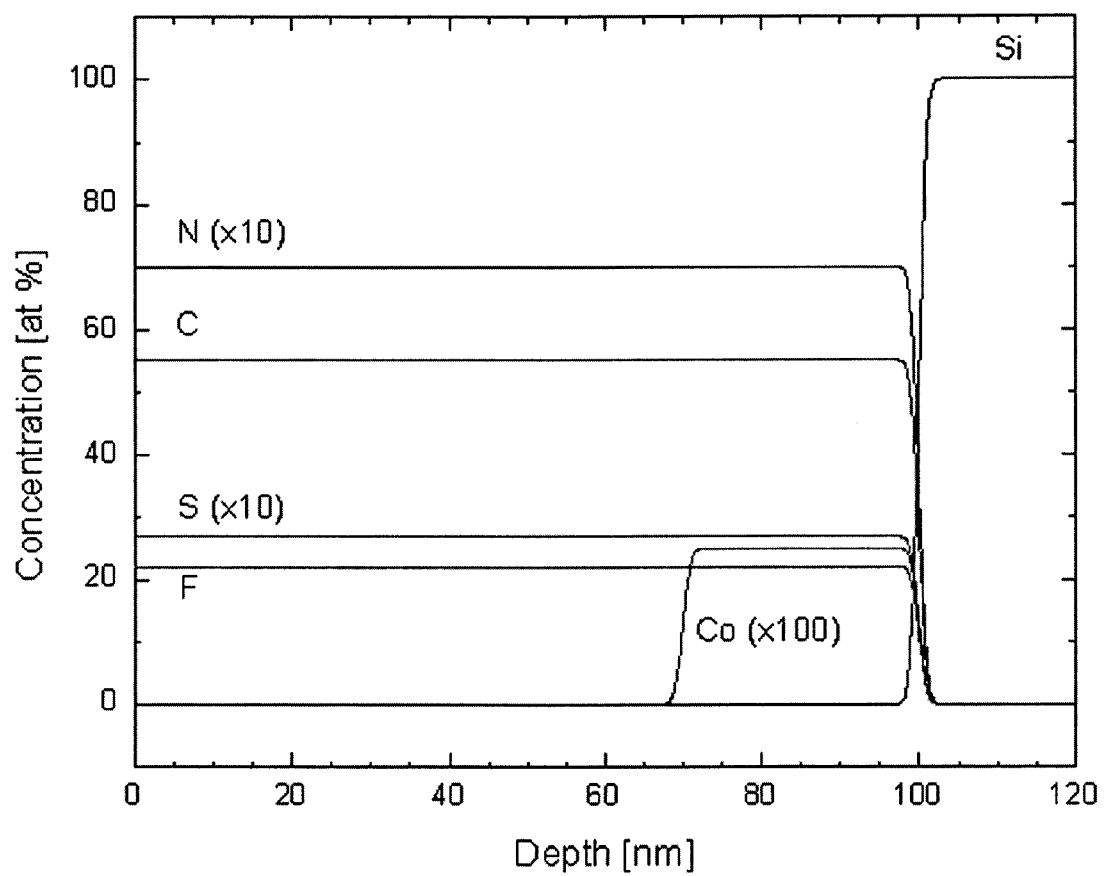

FIG. 7 is a graph of the atomic concentrations as a function of depth as determined by analysis of the RBS spectra for the interface-doped THAP film.

Figure 8:
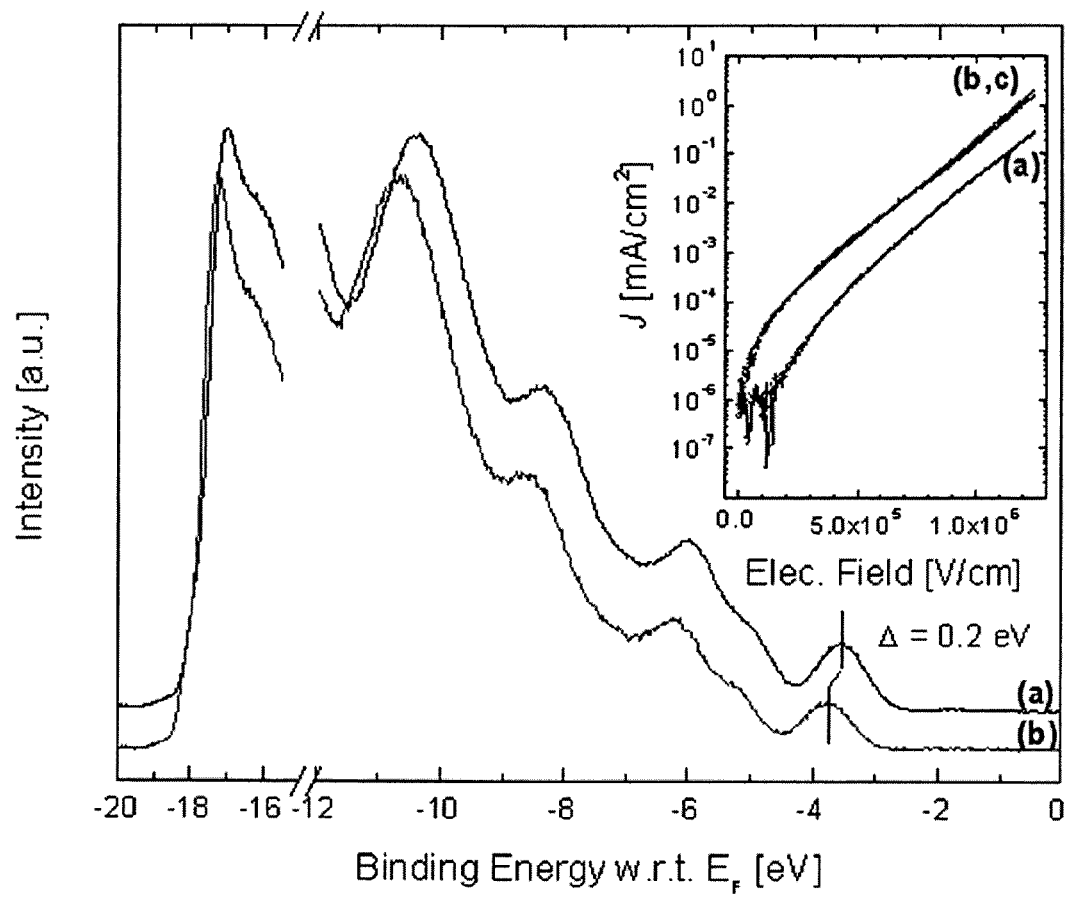

FIG. 8 is a graph of UPS spectra of (b) cobaltocene-doped $Alq_3$ ($p_d=10^{-7}$ Torr) showing the 0.2 eV shift compared to (a) undoped $Alq_3$. The I-V characteristics for (a) undoped, (b) doped, and (c) interface-doped $Alq_3$ devices are plotted in the inset.

DETAILED DESCRIPTION OF THE INVENTION

Figure 1:
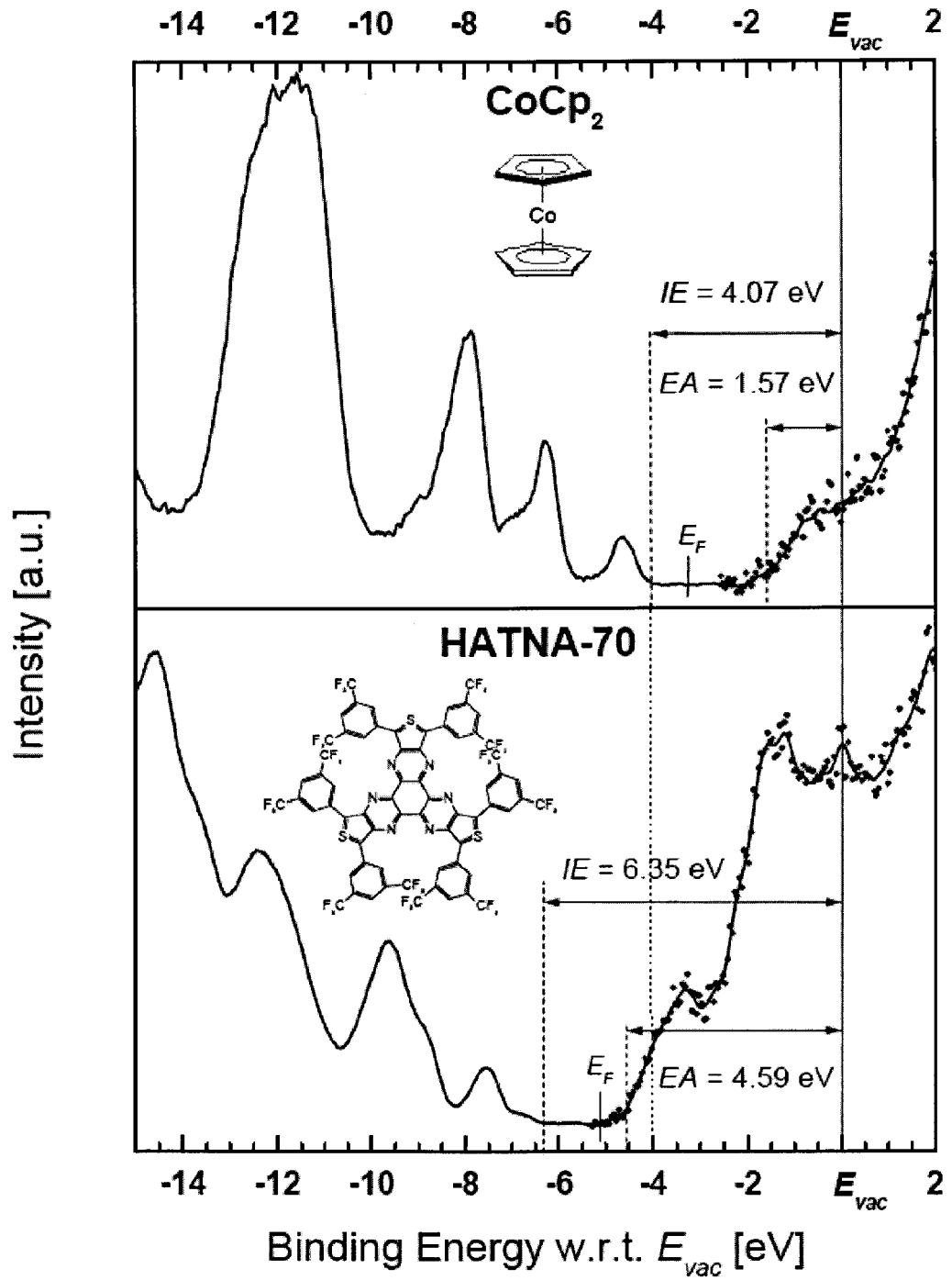

In an effort to find a simple and efficient single molecular n-type dopant, organic metallocenes (see, e.g., Cauletti et al. (1980) J. Electron Spectros. Relat. Phenom., 19:327; Ammeter et al. (1972) J. Chem. Phys., 57:678; Domrachev, et al. (1994) Russ. Chem. Bull., 43:1305; Davis et al. (1995) Inorg. Chem., 34:4585; Lu et al. (2004) Phys. Rev. Lett., 93:116804) were studied. Bis(cyclopentadienyl)cobalt(II) (cobaltocene ($CoCp_2$; FIG. 1 inset) is an efficient electron donor of the class of metallocenes. The gas-phase ionization energy determined by photoemission spectroscopy and atomic orbital calculations is approximately 5.0-5.5 eV, which is low for an isolated molecule (Cauletti et al. (1980) J. Electron Spectros. Relat. Phenom., 19:327; Lu et al. (2004) Phys. Rev. Lett., 93:116804). To date, however, $CoCp_2$ has been used in solution or in uncontrolled sublimation processes and has not led to the fabrication of well-defined bulk-doped films. Notably, cobaltocene has a very high vapor pressure and sublimates in vacuum at room temperature.

Herein, controlled doping of an electron transport material (a hexa-azatrinaphthylene derivative (THAP, HATNA-70; FIG. 1 inset) with an organometallic compound, such as cobaltocene, is demonstrated. Additionally, a dispensing device is provided herein which allows the release of a precise background pressure of gas-phase cobaltocene in the vacuum growth chamber. Using this technique, thin films of pure cobaltocene or of THAP (HATNA-70) doped with cobaltocene are produced. The resultant films are also studied by ultra-violet photoemission spectroscopy (UPS), inverse photoemission spectroscopy (IPES) and x-ray photoemission spectroscopy (XPS). The ionization energy (IE) of the dopant and the electron affinity (EA) of the host are also determined and the composition of the doped film is analyzed. Evidence of efficient n-doping is provided herein by UPS and current voltage measurements.

Cobaltocene and related compounds possess several attractive features as dopants:

(i) The ionization potentials of the dopants can be tuned over a wide energy range. Some of the compounds have very low ionization potentials, thereby suggesting that most organic electron-transport materials with technological relevance might be dopable with these compounds.

(ii) The corresponding cations can be chemically very stable, i.e. the stability of the doped material is only limited by the stability of the radical anion of the transport material.

(iii) The corresponding cations are much larger than those of common metal cations such as alkali cations. As such, the cations will be less mobile than smaller cations under the influence of electric fields. Ionic transport will be unlikely in materials doped in this way.

(iv) The large size of the cation will reduce the electrostatic "charge-trapping" effect of the cation on charge-carrying materials.

(v) Substituents can be incorporated onto the organometallic molecules, thereby allowing one to vary the volatility of the dopant. Alteration of the substituents may also affect the method by which the dopant is deposited and the solubility and resistance to crystallization of the dopant. Indeed, modification of the substituents of the dopant may allow for the dopant to be deposited via solution as opposed to vapor depositing. Dopants with sufficiently low vapor pressure can be introduced via co-evaporation with the host.

In accordance with a particular embodiment of the instant invention, it is demonstrated hereinbelow that cobaltocene is an efficient n-type dopant. In particular, cobaltocene is shown to be an efficient n-type-dopant in the electron transport material, THAP (HATNA-70). The volatile and easily oxidizable $CoCp_2$ was introduced in a vacuum system and incorporated in the THAP (HATNA-70) film via a specially designed dispenser, which allows precise control of the background pressure of the molecule and of the doping ratio. The ionization energy of cobaltocene is ~4 eV, which is sufficiently low to reduce a number of molecules of interest for organic electronics. The incorporation of the metallocene in a THAP (HATNA-70) film causes a 0.56 eV shift of the Fermi-level towards the host LUMO level, which demonstrates n-type doping. The interfacial doping of THAP (HATNA-70) by cobaltocene improves electron injection from PEDOT:PSS by more than three orders of magnitude, as described hereinbelow. Additionally, XPS and RBS experiments were performed to determine the level of dopant incorporation in the bulk of the host film as compared to the film surface or interface. The results indicate that variable and controlled amounts of $CoCp_2$ can be included in a matrix of tris{2,5-bis (3,4-bis-trifluoromethyl-phenyl)thieno}[3,4-b,h,n]-1,4,5,8, 9,12-hexaazatriphenylene (THAP) and that a non-negligible amount of dopant accumulates on the sample surface. Uniformly doped THAP layers show a constant $CoCp_2$ concentration throughout the film. The investigation of spatially confined layers of cobaltocene show excellent spatial stability of the dopants, with no observable diffusion through the film up to temperatures of 60° C.

Organometallic compounds suitable for doping organic transport agents are organic compounds comprising a metal attached directly to a carbon. In a particular embodiment, the organometallic compounds are sandwich molecules wherein a metal atom is sandwiched between two carbocyclic rings (see, e.g., Formulas I-X). In the structures shown, $R_1$-$R_{16}$ can be independently selected, for example, from the group consisting of hydrogen, alkyl, aryl, benzyl, halides, alkoxy, and amino groups, wherein the group may be optionally substituted. In addition, the carbocyclic rings of the organometallic compounds may be fused ring systems (see, e.g., Formula IX, where the ring is an η5-indenyl or substituted indenyl ring). The term "η5" indicates that five carbons of the five-membered ring are coordinated to the metal. The carbocylic ring of the organometallic compounds may also be a heterocyclic ring or have the CR group replaced with, e.g, BR, N, NR, P, PR, O, S, Se, or Te.

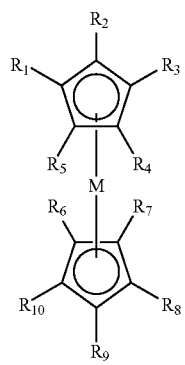

I

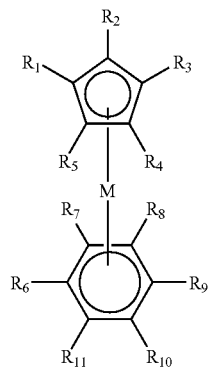

II

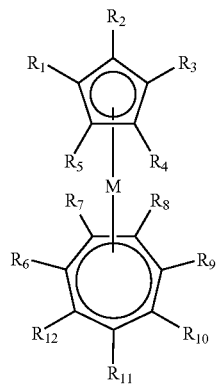

III

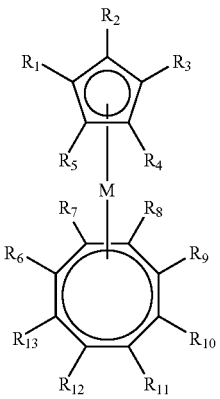

IV

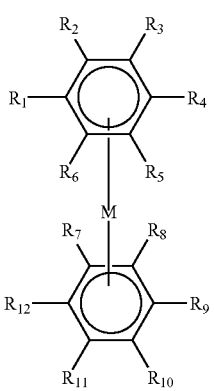

V

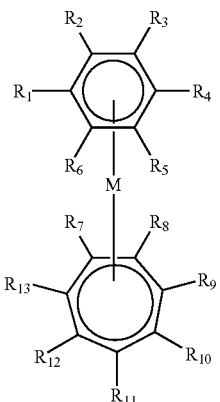

VI

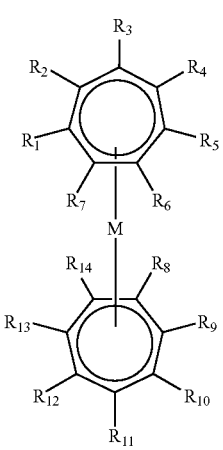

VII

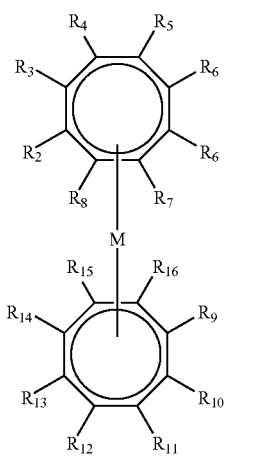

VIII

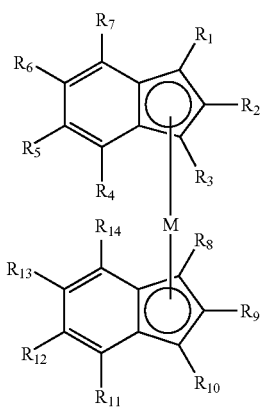

IX

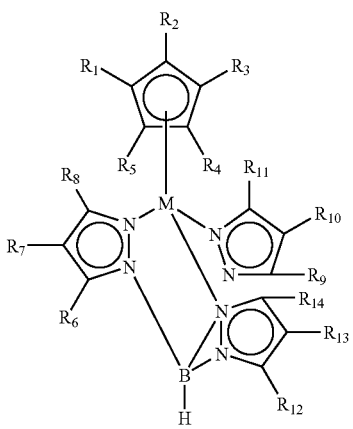

X

The metals (M) of the organometallic compounds of the instant invention include, without limitation, d-block (transition metal) elements and f-block (lanthanide and actinide) elements.

In a particular embodiment, $R_1$, $R_2$, $R_3$, $R_4$, $R_5$, $R_6$, $R_7$, $R_8$, $R_9$, $R_{10}$, $R_{11}$, $R_{12}$, $R_{13}$, $R_{14}$, $R_{15}$ and $R_{16}$ are selected from the group consisting of H; linear or branched, alkyl groups with up to 25 carbons (e.g., 0, 1, 2, 3, 4, 5, 6, 7, 8, 9, 10, 11, 12, 13, 14, 15, 16, 17, 18, 19, 20, 21, 22, 23, 24, 25 carbons in all isomer forms such as normal, secondary, iso- and neo-isomers), —(CH$_2$CH$_2$O)—(CH$_2$)β OR$_{a1}$; —(CH$_2$CH$_2$O)$_\alpha$—(CH$_2$)β-phenyl; —(CH$_2$)β-(OCH$_2$CH$_2$)$_\alpha$R$_{a1}$; —OCH$_2$CH$_2$(CF$_2$)$_\alpha$CF$_3$; —(CH$_2$)β-(OCH$_2$CH$_2$)$_\alpha$phenyl; —(CF$_2$)β-(OCH$_2$CH$_2$)$_\alpha$phenyl; —(CH$_2$)β-(OCH$_2$CH$_2$)$_\alpha$aryl; —(CF$_2$)β-(OCH$_2$CH$_2$)β aryl; —(OCH$_2$CH$_2$)$_\alpha$—(CF$_2$)β aryl; —(OCH$_2$CH$_2$)—(CH$_2$)β aryl; —O(CH$_2$)β aryl; and —O(CF$_2$)β aryl. $R_{a1}$ can be independently selected from linear or branched, alkyl groups with up to 25 carbons (e.g., 0, 1, 2, 3, 4, 5, 6, 7, 8, 9, 10, 11, 12, 13, 14, 15, 16, 17, 18, 19, 20, 21, 22, 23, 24, 25 carbons in all isomer forms such as normal, secondary, iso- and neo-isomers) and an aryl group. Subscript α is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25). Subscript β is an integer number from 0 to 25 (e.g., 0, 1, 2, 3, 4, 5, 6, 7, 8, 9, 10, 11, 12, 13, 14, 15, 16, 17, 18, 19, 20, 21, 22, 23, 24, and 25).

The aryl group can include aromatic ring systems having up to 20 carbons in the aromatic ring framework (e.g., 0, 1, 2, 3, 4, 5, 6, 7, 8, 9, 10, 11, 12, 13, 14, 15, 16, 17, 18, 19, and 20 carbons in all isomer forms, not including carbons on the substituents). The aryl group can include, but is not limited to, the following structures:

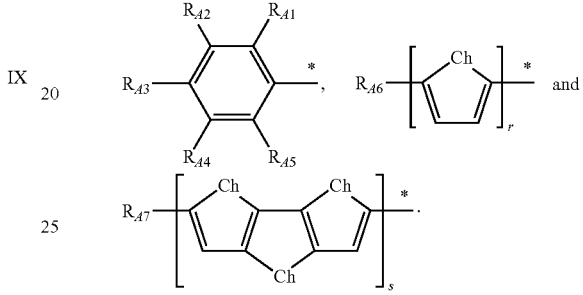

Ch can be an atom such as, but not limited to, Se, S, O, and a combination thereof when more than one Ch is present in the aryl ring system. $R_{A1}$, $R_{A2}$, $R_{A3}$, $R_{A4}$, $R_{A5}$, $R_{A6}$, $R_{A7}$, can each be independently selected from, but not limited to, the following groups: H; a linear or branched alkyl group with up to 25 carbons (e.g., 0, 1, 2, 3, 4, 5, 6, 7, 8, 9, 10, 11, 12, 13, 14, 15, 16, 17, 18, 19, 20, 21, 22, 23, 24, and 25 carbons in all isomer forms such as normal, secondary, iso- and neo-isomers).

The ability of an organometallic reagent to n-dope an organic electron-transport material with complete electron transfer from the dopant to the transport material is determined by the adiabatic solid-state ionization potential (IP) of the dopant, which is the energy change required for the process Dopant->[Dopant]$^+$+e in comparison to the electron affinity (EA) of the transport material. This is the energy change associated with the process Material+e->[Material]$^-$ For doping to be successful, a negative free energy change should be obtained for the process Material+Dopant->[Material]$^-$+[Dopant]$^+$ This means the criterion for doping is $IP+EA-E<0$ where E is the electrostatic attraction between the anion and cation.

In addition, when the quantity [IP+EA−E] is close to zero, but not necessarily negative, partial charge transfer can potentially also be achieved between dopant and transport material. In a particular embodiment, the free energy change associated with electron transfer from the organometallic compound to the electron transporting material is less than +0.5 eV, less than +0.3 eV, less than 0 eV, less than −0.5 eV, less than −1.0 eV, or less than −3.0 eV, or less than −5 eV. The free energy change is preferably less than +0.3 eV and more preferably less than 0 eV.

Guidelines as to the effectiveness of different dopants can also be obtained from the solution electrochemical potential corresponding to one-electron oxidation of the organometallic (Table 1) and from gas-phase IP and EA data (Table 2). Table 1 compares the electrochemical potentials of certain dopants, corrected where necessary to compare to ferrocene ($Fe(C_5H_5)_2$) from the reference electrodes used in the original references. A negative value of this potential is indicative of a greater reducing potential, and, therefore, greater doping ability, than ferrocene. It should be noted that these potentials will depend somewhat upon the solvent employed for the measurement; however, they serve to illustrate the tunability of the potentials for this type of molecule and to show that many species are capable of doping many organic solids.

TABLE 1

Electrochemical potentials for certain organometallic sandwich compounds, arranged in order of increasing reduced power.

| Compound, M | Halfwave electrochemical potential for $M^+/M^0$ vs. that for $Fe(C_5H_5)_2^+/Fe(C_5H_5)_2$ in V | Reference |
| --- | --- | --- |
| $Fe(C_5H_5)_2$ | 0 | By definition |
| $Ni(C_5Ph_4H)_2$ | −0.31 | 1 |
| $Fe(C_5Me_4H)_2$ | −0.45 | 2 |
| $Ni(C_5H_5)_2$ | −0.49 | 3 |
| $Fe(C_5Me_5)_2$ | −0.59 | 4 |
| $Co(C_5H_5)((C_3H_3N_2)_3BH)$ [a] | −0.89 | 5 |
| $Fe(C_9H_7)_2$ [b] | −0.78 | 2 |
| $V(C_5H_5)_2$ | −0.86 | 1 |
| $Co(C_5H_5)(C_5H_5BPh)$ [c] | −0.84 | 6 |
| $Cr(C_5Ph_4H)_2$ | −0.87 | 1 |
| $Co(C_5Me_5)((C_3H_3N_2)_3BH)$ [a] | −0.89 | 5 |
| $Cr(C_5H_5)_2$ | −0.94 | 7 |
| $Mn(C_5Me_5)_2$ | −0.97 | 8 |
| $Ti(C_5H_5)(C_8H_8)$ | −0.99 | 7 |
| $Co(C_5Ph_4H)_2$ | −1.00 | 1 |
| $Mo(C_5H_4Me)(C_7H_7)$ | −1.02 | 7 |
| $Ni(C_5Me_5)_2$ | −1.06 | 3 |
| $Cr(C_6H_6)_2$ | −1.15 | 4 |
| $W(C_5H_4Me)(C_7H_7)$ | −1.18 | 7 |
| $Co(C_5H_5)_2$ | −1.33 | 4 |
| $Co(C_9Me_7)_2$ [b] | −1.44 | 9 |
| $Cr(C_5Me_5)_2$ | −1.45 | 3 |
| $Cr(C_9Me_7)_2$ [b] | −1.55 | 9 |
| $Co(C_5H_5)(C_5Me_5)$ | −1.63 | 2 |
| $Co(C_5H_5)(C_5Me_5)$ | −1.94 | 4 |
| $Fe(C_5H_5)(C_6Me_6)$ | −2.09 | 4 |
| $Fe(C_5Me_5)(C_6Me_6)$ | −2.30 | 4 |

[a] Structure X with $R_1$-$R_5$ either all H or all Me and $R_6$-$R_{14}$ all H.
[b] Structure IX with $R_1$-$R_{14}$ either all H or all Me.
[c] Structure analogous of II with one of the CR groups of the six-membered ring replaced with BPh.
References: 1: Castellani et al. (1987) Organometallics 6: 1703; 2: Barlow et al. (2001) Inorg. Chem., 40: 7047; 3: Robbins et al. (1982) J. Am. Chem. Soc., 104: 1882; 4: Connelly et al. Chem. Rev., 96: 877; 5 Brunker et al. (2001) Chem. Commun., 2052; 6: Koelle et al. (1978) J. Organomet. Chem., 152: 225; 7: Wong et al. (1995) Chem. Mater., 7: 210; 8: Robbins et al. (1979) J. Am. Chem. Soc., 101: 3853; 9: O'Hare et al. (1993) J. Chem. Soc., Dalton Trans., 383.

TABLE 2

Gas-phase vertical ionization potentials of certain organometallic sandwich compounds.

| Compound, M | Vertical Ionization Potential in eV | Reference |
| --- | --- | --- |
| $V(C_5H_5)_2$ | 6.81 | 10 |
| $V(C_5Me_5)_2$ | 5.87 | 10 |
| $Cr(C_5H_5)_2$ | 5.70 | 7 |
| $Cr(C_5Me_5)_2$ | 4.93 | 10 |
| $Cr(C_9Me_7)_2$ [a] | 4.67 | 9 |

TABLE 2-continued

Gas-phase vertical ionization potentials of certain organometallic sandwich compounds.

| Compound, M | Vertical Ionization Potential in eV | Reference |
| --- | --- | --- |
| $Mn(C_5H_5)_2$ | 6.26 | 10 |
| $Mn(C_5H_4Me)2$ | 6.06 | 10 |
| $Mn(C_5Me_5)_2$ | 5.33 | 10 |
| $Fe(C_5H_5)_2$ | 6.86 | 10 |
| $Fe(C_5Me_5)_2$ | 5.88 | 10 |
| $Fe(C_9H_7)_2$ [a] | 6.5 | 11 |
| $Fe(C_9Me_7)_2$ [a] | 5.54 | 11 |
| $Co(C_5H_5)_2$ | 5.55 | 7 |
| $Co(C_5Me_5)_2$ | 4.71 | 10 |
| $Co(C_9H_7)_2$ [a] | 5.82 | 11 |
| $Co(C_9Me_7)_2$ [a] | 4.89 | 11 |
| $Ni(C_5H_5)_2$ | 6.50 | 10 |
| $Ni(C_5Me_5)_2$ | 5.82 | 10 |
| $Mn(C_5H_5)(C_6H_6)$ | 6.36 | 12 |
| $Ti(C_5H_5)(C_7H_7)$ | 6.83 | 12 |
| $V(C_5H_5)(C_7H_7)$ | 6.42 | 12 |
| $Cr(C_5H_5)(C_7H_7)$ | 5.59 | 12 |
| $Mo(C_5H_4Me)(C_7H_7)$ | 5.70 | 7 |
| $W(C_5H_4Me)(C_7H_7)$ | 5.50 | 7 |
| $Ti(C_5H_5)(C_8H_8)$ | 5.67 | 12 |
| $V(1,3,5-C_6H_3Me_3)_2$ | 5.61 | 12 |
| $Cr(C_6H_6)_2$ | 5.4 | 12 |
| $Cr(C_6H_5Me)_2$ | 5.24 | 12 |
| $Cr(1,3,5-C_6H_3Me_3)_2$ | 5.01 | 12 |
| $Mo(C_6H_6)_2$ | 5.52 | 12 |
| $Mo(C_6H_5Me)_2$ | 5.32 | 12 |
| $Mo(1,3,5-C_6H_3Me_3)_2$ | 5.13 | 12 |
| $U(C_8H_8)_2$ | 6.2 | 13 |

[a] Structure IX with $R_1$-$R_{14}$ either all H or all Me.
References: 7: Wong et al. (1995) Chem. Mater., 7: 210; 9: O'Hare et al. (1993) J. Chem. Soc., Dalton Trans., 383; 10: Cauletti et al. (1980) J. Electron Spectrosc. Relat. Phenom., 19: 327; 11: O'Hare et al. (1992) Organometallics 11: 48; 12: Evans et al. (1974) J. Chem. Soc., Dalton Trans., 304; 13: Clark et al. (1976) J. Organomet. Chem., 1976: C14.

Ferrocene itself is known to undergo charge-transfer with some organics such as tetracyanoquinodimethane and can, therefore, be used as a dopant of tetrafluorotetracyanoquinodimethane (TCNQ) and materials with similar EAs. Organometallics whose ionization potential is lower than that of ferrocene or whose electrochemical oxidation potential is negative relative to that of ferrocene, are likely better dopants for organic electron-transport materials as "low ionization potential" organometallics.

Preferred dopants are those with the most negative electrochemical potentials and with the lowest ionization potentials, since these will be suitable for doping the widest range of organic materials. Tables 1 and 2 show that preferred dopants include cobaltocene and its derivatives, such as $Co(C_5Me_5)_2$, and (cyclopentadienyl)(arene)iron derivatives such as $Fe(C_5Me_5)(C_6Me_6)$. An additional consideration is the stability of the cation formed by the organometallic in the doping process. In this regard cobaltocene derivatives are known to form exceptionally stable cations and will, therefore, often be preferred.

The electron transporting material of the instant invention can be any material which has the function of transporting electrons. Examples of electron transporting material include, without limitation, triazole derivatives, oxazole derivatives, oxadiazole derivatives, fluorenone derivatives, anthraquinodimethane derivatives, anthrone derivatives, diphenylquinone derivatives, thiopyranedioxide derivatives, carbodiimide derivatives, fluorenylidenemethane derivatives, distyrylpyrazine derivatives, heterocyclic tetracarboxylic anhydrides (e.g., naphthaleneperylene), various metal complexes (e.g., complexes of phthalocyanine derivatives, 8-quinolinol derivatives, metal phthalocyanines, and metal complexes having ligands of benzooxazole or benzothiazole), electroconductive polymers/oligomers (e.g., aniline copolymers, thiophene oligomers, and polythiophenes), and polymeric compounds (e.g., polythiophene derivatives, polyphenylene derivatives, polyphenylenevinylene derivatives, and polyfluorene derivatives). The electron transporting materials may be used alone or in combination of one or more other kinds. In a particular embodiment, the electron transport material is an organic electron transport material. In a preferred embodiment, the electron transport material is selected from the group consisting of perylene diimides (reduction potential ca. −1.0 V vs. ferrocenium/ferrocene (An et al. (2005) Adv. Mater., 17:2580)), hexazatrinaphthylene-based materials (−1.44 V for hexazatrinaphthylene (Kaafarani et al. (2005) J. Am. Chem. Soc., 127:16358)), $Alq_3$ (−2.3 V (Anderson et al. (1998) J. Am. Chem. Soc., 120:9646)), oxadiazole materials, conjugated polymers including poly (phenylenevinylene)s, bis(dioxaborines) (−1.31 V (Domercq et al. (2004) J. Phys. Chem. B, 108:8647)), and siloles. In yet another embodiment, particularly with regard to the methods of synthesizing the conductive material of the instant invention, the organic electron transport material may also be allotropes of carbon such as $C_{60}$ and $C_{70}$.

As stated hereinabove, $CoCp_2$ and related compounds are volatile and generally cannot be dispensed by the conventional thermal evaporation methods used for other vacuum-deposited "small molecules." Described hereinbelow is a method by which the molecules can be introduced in a controlled fashion in a vacuum system in which the active layer of the organic device is grown, thereby allowing controlled doping of the matrix. The doping level can be more easily controlled than in conventional co-evaporation processes.

Because the cobaltocene is easily oxidized in air, it may first be placed inside a glove-box in a glass ampoule in an inert atmosphere (e.g., a nitrogen atmosphere). The ampoule may then be connected to a growth chamber (based pressure= $10^{-9}$ Torr) through a leak valve and the nitrogen may be evacuated during pump down. The loaded ampoule serves as a source of gas-phase dopant material, which can be leaked in the growth chamber in a controllable fashion. During the deposition of the active organic film, the background pressure of the dopant may be precisely controlled through a standard pressure gauge. The dopant is then incorporated in the organic film during growth. The (molecular) concentration of the dopant can be varied by increasing or decreasing the cobaltocene background pressure. The advantage of the technique is two fold: 1) relative ease of handling and use of a highly oxidizable compound and 2) good control fn the level of incorporation of the dopant.

DEFINITIONS

The following definitions are provided to facilitate an understanding of the present invention:

As used herein, "p-type" doping of organic materials refers to the complete or partial electron transfer from a transport molecule, or from a group of transport molecules, or transport polymer, to a dopant molecule to result in the dopant molecule bearing a full (dopant anion) or partial negative charge and a transport molecule, or from a group of transport molecules, or transport polymer, bearing a full or partial positive charge.

As used herein, "n-type" doping of organic materials refers to the opposite process of p-type doping. More specifically, "n-type" doping refers to the complete or partial electron transfer to a transport molecule, or to a group of transport molecules, or transport polymer, from a dopant molecule to result in the dopant molecule bearing a full (dopant cation) or partial positive charge and a transport molecule, or from a group of transport molecules, or transport polymer, bearing a full or partial negative charge.

As used herein, the term "electron withdrawing group" refers to an atom or substituent that has a relatively high electronegativity, or an ability to acquire electrons from other atoms or groups. An "electron withdrawing group" is capable of withdrawing electrons relative to that of hydrogen if the hydrogen atom occupied the same position on the molecule. The term "electron withdrawing group" is well understood by one skilled in the art and is discussed, for example, in Advanced Organic Chemistry by J. March, John Wiley & Sons, New York, N.Y., (1985). Examples of electron withdrawing groups include, but are not limited to, halo (e.g., fluorine, chlorine, bromine, iodine), nitro, carboxy, cyano, aryl (optionally substituted), heteroaryl, (optionally substituted), $—OC(A)_3$, $—C(A)_3$, $—C(A)_2-O—C(A')_3$, $—(CO)$- Q, $—SO_2—C(A)_3$, $—SO_2$-aryl, $—C(NQ)Q$, $—CH=C(Q)_2$, and $—C\equiv C$-Q; in which each A and A' is independently H, halo, $—CN$, $—NO_2$, $—OH$, or $C_{1-4}$ alkyl optionally substituted with 1-3 halo, $—OH$, $NO_2$; and Q is selected from the group consisting of H, $—OH$, alkyl optionally substituted with 1-3 halo, $—OH$, $—O$-alkyl, and $—O$-cycloalkyl.

The terms "halogen," "halo," and "halide" refer to chlorine, bromine, fluorine or iodine.

The term "alkyl," as employed herein, includes both straight and branched chain hydrocarbons containing 1 to 25 carbons. Examples of suitable alkyl groups include methyl, ethyl, propyl, isopropyl, butyl, t-butyl, isobutyl, pentyl, hexyl, isohexyl, heptyl, 4,4-dimethylpentyl, octyl, 2,2,4-trimethylpentyl, nonyl, decyl, undecyl, dodecyl, tridecyl, tetradecyl, pentadecyl, hexadecyl, heptadecyl, octadecyl, nonadecyl, etc. and the various branched chain isomers thereof, and the like. Each alkyl group may optionally be substituted. Substituents include, for example, halogen, alkyl, alkoxy, hydroxy, aryl, aryloxy, aralkyl, cycloalkyl, alkenyl, alkylamido, alkanoylamino, oxo, acyl, arylcarbonylamino, amino, substituted amino, nitro, cyano, thiol and/or alkylthio.

The term "cycloalkyl," as employed herein includes saturated or unsaturated cyclic hydrocarbon groups containing 1 to 3 rings, that is, monocyclic alkyl, bicyclic alkyl and tricyclic alkyl. Cycloalkyl groups may contain a total of 3 to 20 carbons forming the ring(s), preferably 3 to 10 carbons forming the ring(s), and may optionally be fused to 1 or 2 aromatic rings as described for aryl, below. Unsaturated cycloalkyl groups may contain one or more double bonds or triple bond. Cycloalkyl groups include, without limitation, cyclopropyl, cyclobutyl, cyclopentyl, cyclohexyl, cycloheptyl, cyclooctyl, cyclodecyl and cyclododecyl, cyclopentenyl, cyclohexenyl, cycloheptenyl, cyclooctenyl, cyclohexadienyl, cycloheptadienyl, and the like. Each cycloalkyl group may be optionally substituted. Substituents include, without limitation, halogen, alkyl, alkoxy, hydroxy, aryl, aryloxy, alkenyl, aralkyl, cycloalkyl, alkylamido, alkanoylamino, oxo, acyl, arylcarbonylamino, amino, substituted amino, nitro, cyano, thiol and/or alkylthio. Cycloalkyls may contain heterocyclic rings (i.e., the cycloalkyl may contain at least one non-carbon atom in the ring framework (a heterocycloalkyl)).

The term "aryl," as employed herein, refers to monocyclic, bicyclic, and tricyclic aromatic groups containing up to 20 carbons in the aromatic ring framework. Examples of aryl groups include, without limitation, phenyl or naphthyl, such as 1-naphthyl and 2-naphthyl, or indenyl. Aryl groups may optionally include one to three additional rings fused to a cycloalkyl ring or a heterocyclic ring. Aryl groups may be optionally substituted. Substituents include, without limitation, halogen, alkyl, alkoxy, hydroxy, alkenyl, aryl, aryloxy, aralkyl, cycloalkyl, alkylamido, alkanoylamino, oxo, acyl, arylcarbonylamino, amino, substituted amino, nitro, cyano, thiol and/or alkylthio.

"Heteroaryl" refers to an optionally substituted, mono-, di-, tri-cyclic aromatic ring system (aryl) that includes at least one non-carbon atom (e.g., sulfur, oxygen, nitrogen, or selenium) ring member. Non-limiting examples of heteroaryl groups include pyrryl, furyl, pyridyl, 1,2,4-thiadiazolyl, pyrimidyl, thienyl, isothiazolyl, imidazolyl, tetrazolyl, pyrazinyl, pyrimidyl, quinolyl, isoquinolyl, thiophenyl, benzothienyl, isobenzofuryl, pyrazolyl, indolyl, purinyl, carbazolyl, benzimidazolyl, isoxazolyl, and the like. As with aryl groups, heteroaryl groups may be may be optionally substituted.

The term "electronic device" includes a collection of circuits, organic electronic components, or combinations thereof that, when properly supplied with the proper potential, performs a function. An electronic device may include or be part of a system. Electronic devices include consumer and industrial electronic products.

The term "inert atmosphere" refers to an environment having no more than 1% oxygen. In a preferred embodiment, an inert atmosphere is an oxidant-free condition. An inert atmosphere is used to avoid oxidization of a material. Inert atmospheres include, without limitation, gases such as nitrogen, argon, helium, neon, and the like and combinations thereof. As used herein, "organic" generally refers to a material that is composed of one or more carbon atoms. The organic compound may contain carbon atoms which are covalently bound to at least one hydrogen atom and/or heteroatom. Heteroatoms are any atom that is not carbon or hydrogen. Preferred heteroatoms include, without limitation, N, O, P, Si, S, and halogens (e.g., F, Cl, Br, and I). In a particular embodiment of the instant invention, allotropes of carbon (e.g., $C_{60}$) and/or simple oxides of carbon (e.g., carbon monoxide and carbon dioxide) are excluded from the term "organic" (e.g., when referring to an organic electron transporting material).

The term "allotrope," as used herein, refers to a different structural form of an element.

As used herein, the term "doping" generally refers to the addition of a compound to a polymeric material to achieve a desired electrical characteristic.

As used herein, the term "conductive material" refers to a material which can conduct electricity.

As used herein, "electron affinity" refers to the tendency of an atom to attract or bind a free electron into one of its orbitals.

As used herein, "ionization potential" or "ionization energy" refers to the energy required to remove an electron from an atom and form an ion.

The following examples describe illustrative methods of practicing the instant invention and are not intended to limit the scope of the invention in any way.

EXAMPLE 1

Methods

All experiments were conducted at Princeton University in a three-chamber ultrahigh vacuum (UHV) system equipped for organic film growth, UPS, XPS and IPES analysis, and in-situ current-voltage (I-V) measurements. Although solid at room temperature and at atmospheric pressure, $CoCp_2$ spontaneously sublimates under vacuum with a room temperature partial vapor pressure of at least $1 \times 10^{-6}$ Torr. Therefore, a dispensing mechanism similar to that used for the controlled release of gases in UHV experiments is used for $CoCp_2$ (Sigma-Aldrich). The dopant was loaded under inert atmosphere into a glass ampoule, which was subsequently sealed under nitrogen to a UHV leak valve modified with a 5 mm diameter stainless steel focusing tube. The leak valve provides the ability to regulate a precise background pressure of $CoCp_2$ vapor released in vacuum. The dispenser setup was mounted on a UHV sample preparation chamber equipped with a THAP (HATNA-70) evaporation cell and connected to the growth chamber and to the analysis chamber, allowing sample preparation and characterization without breaking vacuum. Experiments were conducted at base pressures of than $2 \times 10^{-10}$, $6 \times 10^{11}$, and $1 \times 10^{-9}$ Torr in the preparation, analysis, and growth chambers, respectively. The leak valve of the ampoule loaded with $CoCp_2$ and $N_2$ is opened in situ prior to first use in order to evacuate the inert gas.

THAP (HATNA-70) was synthesized and purified at the Georgia Institute of Technology. It was placed in two standard thermal evaporation cells, one located in the preparation chamber for the growth of thin doped films, and the other in the growth chamber for the deposition of thicker films for I-V measurements. The typical sublimation temperature for THAP (HATNA-70) is 350° C.

Films of pure cobaltocene were grown for UPS and IPES measurements by condensing $CoCp_2$ onto a platinum substrate cooled to 77 K. Doped THAP (HATNA-70) films were obtained by growing the host layers in a background of cobaltocene with a partial pressure controlled by the leak valve and tuned to obtain the desired doping concentration. The THAP (HATNA-70) deposition rate was monitored with a quartz crystal microbalance, assuming a bulk density of 1.5 g·cm$^{-3}$ for the organic material, while the background pressure of gas-phase cobaltocene was monitored with a standard pressure ionization gauge.

Unless otherwise specified, all films were grown on poly-3,4-ethylenedioxythiophene-polystyrenesulfonate (PEDOT:PSS) substrates. PEDOT:PSS (Baytron 8000) is spun at 4000 rpm for 60 seconds onto indium tin oxide (ITO)/glass substrates, which are previously mechanically and solvent cleaned and exposed to UV-ozone for one hour. The resulting 50 nm-thick PEDOT:PSS film was then annealed at 180° C. for one hour. The substrates were immediately transferred from the nitrogen glove box into vacuum using a sealed nitrogen container.

Occupied electronic states were measured with UPS using the He I (hv=21.22 eV) and He II (hv=40.8 eV) photon lines of a helium discharge lamp, while unoccupied electronic states were measured using IPES in the isochromat mode (Wu et al. (1997) Chem. Phys. Lett., 272:43). All the spectra presented here were referenced to, and aligned at, the Fermi-level ($E_F$) of the experimental system determined by UPS and IPES measurements on a clean Au sample (Chan (2006) Adv. Funct. Mater., 16:831). The position of the vacuum level ($E_{vac}$) of each surface was determined by adding the photon energy to the low-energy secondary electron cut-off (Cahen (2003) Adv. Mat., 15:271). XPS (Al—Kα line; hv=1486.6 eV) was used to determine chemical composition and doping ratio. Experimental resolutions were 0.15 eV in UPS, 0.5 eV in IPES and 0.9 eV in XPS.

The I-V measurements were conducted in vacuum on ~100 nm undoped or interfacially doped THAP (HATNA-70) films grown on PEDOT:PSS. The top contact consists of 25 nm thick Au pads of varying dimensions. Measurements were done at room temperature using a HP4155A analyzer.

Results

Since cobaltocene has a very high vapor pressure, pristine films of the dopant were grown on a sputter-cleaned platinum substrate cooled to 77K using a closed-cycle helium refrigerator and placed in proximity to the focusing tube of the leak valve. The sample was exposed to a $CoCp_2$ vapor pressure of $2.5 \times 10^{-7}$ Torr for two minutes. Assuming a sticking coefficient close to unity at low temperature, this pressure leads to a deposition rate of about 0.25 monolayer/sec (1 Langmuir=1 monolayer·s$^{-1}$ at $10^{-6}$ Torr). The thickness of the pure $CoCp_2$ films was therefore estimated at 30 molecular layers. The spectra of the occupied and unoccupied states of pure $CoCp_2$, measured by UPS and IPES, respectively, are shown in FIG. 1, along with those measured from a 80 Å-thick film of THAP (HATNA-70) deposited on Au. The relative positions of the highest occupied molecular orbital (HOMO) of the dopant and the lowest unoccupied molecular orbital (LUMO) of the host material are important considerations. Conventionally, IE and EA of the condensed phase materials were determined as the energy difference between the vacuum level ($E_{vac}$) and the onset of the HOMO and LUMO features, respectively (Ishii et al. (1997) IEEE Transaction on Electronic Devices, 44:1295; Hill et al. (1998) Appl. Phys. Lett., 73:662). Accordingly, EA=1.57 eV and IE=4.07 eV for $CoCp_2$, and EA=4.59 eV and IE=6.35 eV for THAP (HATNA-70). The ionization energy of $CoCp_2$ is consistent with the gas-phase ionization energy of 5.0-5.5 eV (Cauletti et al. (1980) J. Electron Spectros. Relat. Phenom., 19:327; Lu et al. (2004) Phys. Rev. Lett., 93:116804) modified by the condensed-phase polarization energy, which is generally of the order of 1 eV for molecular solids (Sato et al. (1981) J. Chem. Soc. Faraday Trans., 2/77: 1621; Tsiper et al. (2002) Chem. Phys. Lett., 360:47). Its unusually low value indicates that cobaltocene will efficiently reduce a host molecule that has an EA≧about 4 eV. With an electron affinity of 4.59 eV, THAP (HATNA-70) is a good candidate for investigating the doping properties of cobaltocene. XPS on the pristine $CoCp_2$ film reveals the presence of carbon and cobalt only. Because the molecule is so readily oxidized, the absence of oxygen is important to confirm that the measured energy levels are those of the neutral non-oxidized cobaltocene.

The effect of $CoCp_2$ doped into a matrix of THAP (HATNA-70) was also investigated by studying the electronic structure of the doped film with UPS. The occupied state spectrum of the PEDOT:PSS substrate is plotted in FIG. 2a and shows a work function of 5.08 eV, which is typical for a high-quality PEDOT:PSS film. Twenty-five Angstroms of THAP (HATNA-70) were then evaporated onto the PEDOT:PSS at room temperature (FIG. 2b) to determine the position of the HOMO level of the undoped host and the electron barrier for injection from the conducting polymer. The ionization energy of THAP (HATNA-70) on PEDOT:PSS is 6.49 eV and the hole injection barrier is $\phi_{Bh}$=0.89 eV, which translates to an electron injection barrier of $\phi_{Be}=E_G-\phi_{Bh}$=0.87 eV (Table 3). The interface dipole between polymer and molecular film is 0.52 eV (up from PEDOT:PSS into THAP (HATNA-70)). The 0.14 eV difference between IE (THAP (HATNA-70)) on PEDOT:PSS and that on Au could be the result of a difference in polarization induced in the conducting polymer substrate with respect to the metal substrate (Tsiper et al. (2002) Chem. Phys. Lett., 360:47; Amy et al. (2005) Org. Elect., 6:85), or of different molecular orientation and film morphology on the two substrates.

TABLE 3

Electron and hole barriers ($\phi_{Be}$, $\phi_{Bh}$) between undoped THAP (HATNA-70) deposited on Au and PEDOT:PSS.

| Electrode material | $\phi_{Be}$ (eV) | $\phi_{Bh}$ (eV) |
|---|---|---|
| Au (WF = 5.1 eV) | 0.53 | 1.23 |
| PEDOT:PSS (WF = 5.08 eV) | 0.87 | 0.89 |

$\phi_{Bh}$ is the energy difference measured by UPS at the interface between the electrode Fermi level and the onset of the HOMO peak.
$\phi_{Be}$ is obtained by subtracting $\phi_{Bh}$ from the onset-to-onset gap of THAP (HATNA-70) (1.76 eV in FIG. 1).

The cobaltocene-doped THAP (HATNA-70) layers were deposited in 25 Å increments and examined via UPS and XPS. These layers were grown at a rate of 1 Å·s$^{-1}$, as measured by quartz microbalance. Taking the nominal size of the host molecule to be 10 Å, the deposition rate corresponds approximately to 0.1 monolayers per second (ML·s$^{-1}$). Using a $CoCp_2$ background pressure of 1×10$^{-7}$ Torr and assuming full incorporation of the dopant molecules at the surface of the THAP (HATNA-70) film, the host-to-dopant molecular ratio in the doped film is expected to be 1:1. Core level data from XPS show a nominal 36:6:3 atomic ratio of fluorine, nitrogen, and sulfur in THAP (HATNA-70), and give a 1.6:1 molecular ratio of THAP (HATNA-70)-to-cobaltocene, as determined by the fluorine and cobalt peaks.

Figure 2:
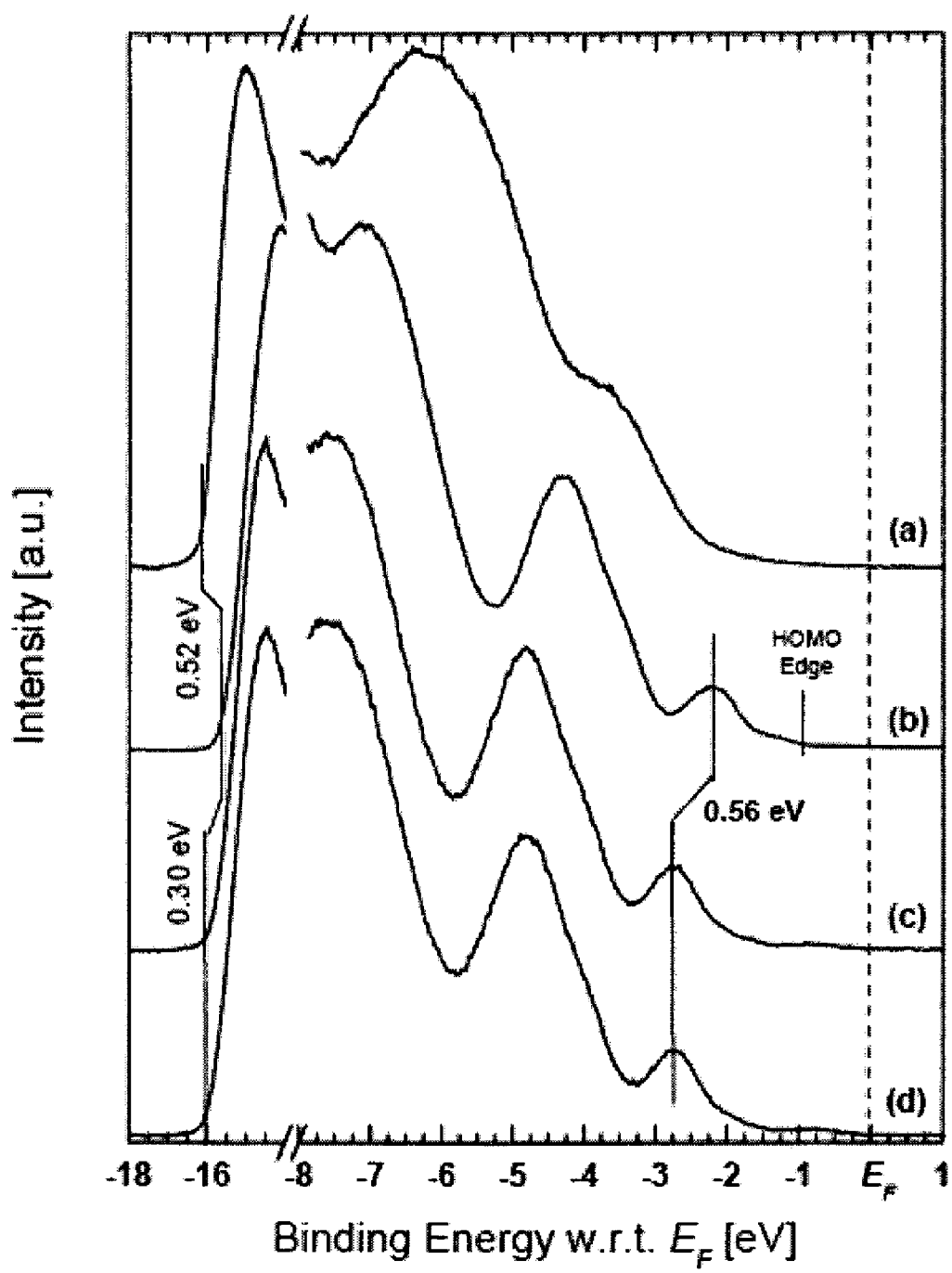
FIG. 2 is a graph of the UPS (He I) spectra of (a) as-loaded PEDOT:PSS; (b) 25 Å of undoped THAP (HATNA-70) grown on PEDOT:PSS; and (c) 25 Å and (d) 50 Å of $COCP_2$-doped THAP (HATNA-70) grown on undoped THAP (HATNA-70). The 0.56 eV shift toward higher binding energy in (c) and (d) corresponds to the doping-induced shift of EF toward the THAP (HATNA-70) LUMO.

The UPS spectra of 25 Å and 50 Å $CoCp_2$-doped THAP (HATNA-70) films grown on top of undoped THAP (HATNA-70) are shown in FIGS. 2c and 2d. The relatively large concentration of $CoCp_2$ molecules in the THAP (HATNA-70) film does not modify appreciably the line-shape of the valence spectra, suggesting that the doping concentration could be significantly less than 1.6:1. The most striking aspect of these spectra is the 0.56 eV shift of the occupied states toward higher binding energy. Since the energy scale is referenced to $E_F$, this corresponds to a 0.56 eV shift of the THAP (HATNA-70) HOMO (LUMO) away from (closer to) $E_F$. The final $E_F$ position in the THAP (HATNA-70) gap is ~0.22 eV below the onset of the unoccupied states, which is indicative of significant n-type doping of HATNA-70 by cobaltocene. Although the whole THAP (HATNA-70) spectrum does shift rigidly toward higher binding energy, the vacuum level shifts by only 0.3 eV. The difference may be due to (near) surface effects that are difficult to quantify, in particular the presence of ionized $CoCp_2$ molecules at or just below the THAP (HATNA-70) surface, which could affect surface dipole and vacuum level.

Doping is further tested using I-V measurements on two single-layer device structures: (i) PEDOT:PSS/100 nm THAP (HATNA-70)/25 nm Au, and (ii) PEDOT:PSS/15 nm 25% CoCp2-doped THAP (HATNA-70)/85 nm THAP (HATNA-70)/25 nm Au. The structure of the doped device is shown in inset in FIG. 3. PEDOT:PSS is generally considered as an efficient high work-function hole-injector. PEDOT:PSS is also selected here because of the relatively large (0.87 eV) electron injection barrier formed with THAP (HATNA-70) (FIG. 2b, Table 1), which makes the system particularly relevant for evaluating the role of cobaltocene in improving electron injection via n-doping of the organic layer.

Figure 3:
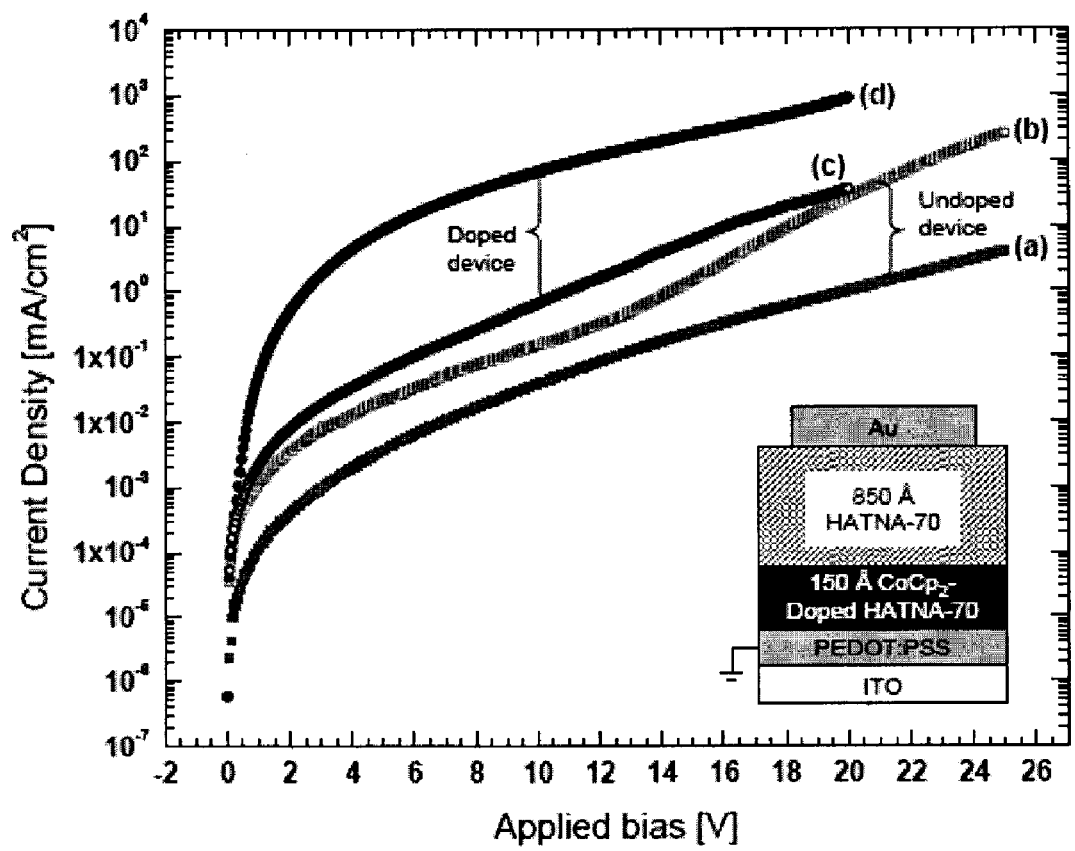
FIG. 3 is a graph of the I-V characteristics of the PEDOT:PSS/100 nm THAP (HATNA-70)/25 nm Au and PEDOT:PSS/15 nm 30% $CoCp_2$-doped THAP (HATNA-70)/85 nm THAP (HATNA-70)/25 nm Au devices. (a) and (b): electron injected from the bottom PEDOT:PSS and top Au in the undoped device, respectively; (c) and (d): electron injected from the top Au and bottom PEDOT:PSS in the doped device, respectively.

The normalized current density through these two devices is plotted in FIG. 3. The four curves correspond to electron injection (a) from the bottom PEDOT:PSS and (b) from the top Au in the undoped device; (c) from the top Au and (d) from the bottom PEDOT:PSS in the doped device. In (a) and (d), the top contact is biased positively (forward bias) to test electron injection from the bottom PEDOT:PSS. In (b) and (c), the top contact is biased negatively (reverse bias) to test electron injection from the top Au. The hole injection barrier at the Au/THAP (HATNA-70) interface is 1.23 eV (Table 1), which is significantly larger than the 0.87 eV electron injection barrier at the PEDOT:PSS-THAP (HATNA-70) interface. This bias polarity is therefore expected to result in a single-carrier (electron) current, even for the undoped device. When the interfacial THAP (HATNA-70) layer was doped with cobaltocene, the forward-bias current increased by more than three orders of magnitude (curve (d) in FIG. 3). In light of the above, this increase is attributed entirely to an increase in the electron current injected from the bottom PEDOT:PSS.

Reversing the polarity, e.g. negative bias on the top Au, results in a current that is slightly larger in the doped than in the undoped device (curves (c) vs. (b) in FIG. 3), although the two are far closer than for electron injection from the bottom electrode. The interface energetics obtained from UPS show that the electron injection barrier is lower at the Au interface than the hole injection barrier at the PEDOT:PSS interface (Table 1). Accordingly, the reverse-bias current consists mainly of electrons injected from the top Au electrode, which is the contact that remains undoped in both devices. The fact that nearly identical reverse-bias current densities are observed for undoped and interfacially doped THAP (HATNA-70) devices confirms therefore that the 3-order-of-magnitude increase in the forward-bias current is a result of the improved contact. Without being bound by theory, this current enhancement is most likely due to the lowering of the effective electron injection barrier via formation of a space-charge layer near the PEDOT:PSS interface, which enhances electron tunneling to the THAP (HATNA-70) LUMO. Notably, the current enhancement is of the same order of magnitude as that obtained for the interfacial p-doping of α-NPD (N,N'-diphenyl-N,N'-bis(1-naphthyl)-1,1'-biphenyl-4,4'-diamine) with F4-TCNQ (tetrafluorotetracyanoquinodimethane) (Gao et al. (2003) J. Appl. Phys., 94:359). As for α-NPD:F4-TCNQ, it is expected that doping of the entire organic film would lead to a further enhancement of the current by several orders of magnitude, as the conductivity of the entire film would be dramatically increased in addition to the lowering of the effective injection barrier (Gao et al. (2003) J. Appl. Phys., 94:359).

EXAMPLE II

Described hereinabove is a means of dispensing in ultra-high vacuum (UHV) a volatile organometallic complex, bis (cyclopentadienyl)cobalt(II), also known as cobaltocene ($CoCp_2$), without exposure of the air-sensitive complex to ambient conditions. This electron-rich molecule was used as an n-dopant in a matrix of tris{2,5-bis(3,4-bis-trifluoromethyl-phenyl)thieno}[3,4-b,h,n]-1,4,5,8,9,12-hexaazatriphenylene (THAP). In this system, the relative values of the IE of cobaltocene (4.0 eV) and the electron affinity (EA) of THAP (4.6 eV) suggests an efficient electron transfer from dopant to host (FIG. 4A). Indeed, n-type doping was confirmed by a 0.56 eV shift of the Fermi-level ($E_F$) in THAP towards the lowest unoccupied molecular orbital (LUMO) (FIG. 4B) and a $10^3$-fold increase in the current density through doped THAP films.

By assuming a uniform doping profile in the host matrix, it was calculated that films deposited at a rate of 1 Å/s in a partial pressure of $10^{-7}$ Torr of $CoCp_2$ should comprise about one dopant molecule per host molecule. However, comparison of the intensities of the Co 2p and N is core level peaks observed using X-ray photoemission spectroscopy (XPS) indicated a cobaltocene:THAP ratio of 1:1.6. A precise determination of the doping concentration by chemical analysis was further hindered by the possibility of preferential $CoCp_2$ absorption on the surface after film preparation.

Here, a variety of cobaltocene/THAP samples were investigated using XPS and compared to data obtained with Rutherford backscattering (RBS), which provides a depth profile of the elemental composition of the films. The results indicate that controlled bulk doping of THAP by $CoCp_2$ can be achieved by varying the partial pressure of the dopant from $10^{-7}$ Torr (30%) to $5\times10^{-9}$ Torr (<1%). Cobaltocene concentrations within that range produce similarly efficient doping effects in THAP. Investigation of spatially doped THAP layers showed no discernable diffusion of $CoCp_2$ through the film.

Incorporation of cobaltocene into a more commonly used electron-transport material, tris(8-hydroxyquinolinato) aluminum ($Alq_3$), is also studied herein. The results are compared with those obtained for THAP. The inefficient incorporation of $CoCp_2$ in $Alq_3$, which has an EA of only 2.0 eV (Kahn et al. (2003) J. Polymer Sci, Polymer Phys., 41:2529), is linked to the nearly 2.0 eV barrier for electron donation from dopant to host in this system. A small 0.2 eV shift of $E_F$ in doped $Alq_3$, and a minor improvement in device performance is attributed mainly to the modification of the energy-level alignment at the anode-$Alq_3$ interface.

Methods

Experiments were conducted in a three-chamber UHV system equipped for organic and metallic film growth (growth chamber), co-evaporation of host and dopants and in situ current-voltage (I-V) measurements (preparation chamber), and ultraviolet photoemission spectroscopy (UPS) and XPS (analysis chamber). Cobaltocene was loaded under a purged nitrogen environment as received from Sigma-Aldrich into a quartz ampoule and sealed onto a leak-valve. The apparatus was then mounted onto the UHV preparation chamber ($p_{base}=2\times10^{-10}$ Torr) without exposing the contents of the ampoule to air. The high vapor pressure of cobaltocene results in spontaneous sublimation under vacuum at room temperature, with the partial pressure controlled by the leak valve.

THAP was synthesized as previously described (Barlow et al. (2007) Chemistry 13:3537-3547) and placed into two thermal evaporation cells: one in the preparation chamber for the growth of doped THAP films and one in the growth chamber ($p_{base}=1\times10^{-9}$ Torr) for deposition of undoped films. THAP, which sublimes at 350° C. at $10^{-9}$ Torr, was thoroughly outgassed prior to use. Unless otherwise specified, all films were grown on poly-3,4-ethylenedioxythiophene-polystyrenesulfonate (PEDOT:PSS, Baytron 8000) spun onto indium tin oxide (ITO)/glass substrates at 4000 rpm for 60 seconds. The ITO was prepared by mechanical and solvent cleaning and exposed to UV-ozone for 1 hour. The 50 nm-thick PEDOT:PSS films were annealed at 180° C. for 1 hour and immediately transferred from the nitrogen glove box into vacuum using a sealed nitrogen container.

XPS was conducted in the analysis chamber ($p=6\times10^{-11}$ Torr) using the Al Kα X-ray source (hv=1486.6 eV). The detection limit of the technique was estimated to be on the order of a few molecular percent with a spectral resolution of 0.9 eV. A control sample of pure $CoCp_2$ was condensed onto a sputter-cleaned platinum substrate that was cooled to 77 K by a closed-cycle helium refrigerator and examined with XPS at low temperature. Doped films of THAP with a thickness of 6 nm were prepared at room temperature by depositing the host material at 1 Å/s under different partial pressures ($p_d$) of cobaltocene: $10^{-7}$ Torr, $5\times10^{-8}$ Torr, and $5\times10^{-9}$ Torr. A sample used to investigate the effects of preferential surface adsorption of $CoCp_2$ was prepared by exposing an undoped 6 nm THAP film to a cobaltocene partial pressure of $p_d=10^{-7}$ Torr for 5 minutes.

To investigate the process of dopant diffusion in the host film, a 5 nm-thick film of THAP doped at $10^{-7}$ Torr of $CoCp_2$ was grown on Au followed by the deposition of 20 nm of pristine THAP (interface-doped sample). The sample was kept in the growth chamber in the absence of cobaltocene for 16 hours so that the pressure in the preparation chamber could recover to $5\times10^{-9}$ Torr. The sample was then transferred through the preparation chamber and into the analysis chamber for XPS analysis. After an initial scan, the sample was then annealed at 50° C. for 30 minutes and at 60° C. for an additional hour, with XPS performed after each annealing step.

To supplement the XPS data, RBS experiments were performed by Evans Analytical Group (Sunnyvale, Calif.) using a 2.275 MeV $He^{2+}$ ion beam incident on the sample at 75° from the sample normal. Backscattered He atoms were collected with an RBS detector 20° offset from the incident beam. Experimental conditions allowed for a spatial resolution of 2.5 nm and a Co detection limit of 0.05 atomic % (5 mol %). The hydrogen concentration was simultaneously determined by hydrogen forward scattering (HFS) with the detector positioned 75° from the sample normal in the forward scattering direction. Four samples were prepared at Princeton using the aforementioned UHV system on Si(100) substrates: (i) 100 nm of pristine THAP; (ii) 100 nm of doped THAP grown with pd=$10^{-7}$ Torr; (iii) 100 nm of doped THAP grown with pd=$10^{-9}$ Torr; (iv) 30 nm of doped THAP ($p_d$=$10^{-7}$ Torr) underneath 70 nm of undoped THAP and annealed to 60° C. for 1 hour. The samples were removed from vacuum, sealed in containers under $N_2$, shipped to Evans Analytical, and transferred into the RBS apparatus with minimal exposure to ambient air.

For the $Alq_3$ experiments, pre-purified undoped and doped ($p_d$=$10^{-7}$ Torr) $Alq_3$ layers were deposited onto clean Al substrates for analysis with UPS (hv=21.22 eV) and XPS. Current-voltage measurements were performed on Al/200 nm organic/Al diode devices where the organic layer consisted of (i) pristine Alq3, (ii) $Alq_3$ deposited with $p_d$=$10^{-7}$ Torr of cobaltocene, and (iii) pristine $Alq_3$ in which 15 nm of the bottom interface is doped with CoCp2 at a pressure of 5×$10^{-8}$ Torr. Another sample consisting of 100 nm of $Alq_3$ deposited onto Si(100) with $p_d$=$10^{-7}$ Torr was also prepared for RBS analysis.

Results

The Co 2p core levels measured on a pristine cobaltocene film and on doped THAP films deposited under decreasing partial pressures of cobaltocene are shown in FIGS. 5A-5D. The core level measured on the interface-doped sample used for diffusion studies is plotted in FIG. 5E, with subsequent annealing steps shown in FIGS. 5F-5G. Finally, the spectrum corresponding to an undoped THAP film, the surface of which was exposed to a cobaltocene pressure of $10^{-7}$ Torr for 5 minutes, is displayed in FIG. 5H.

The pure cobaltocene film shows two main core levels at binding energies (BE) of 783 eV and 797 eV, which correspond to the spin-orbit split Co $2p_{3/2}$ and Co $2p_{1/2}$ levels. The peaks appear to be broadened by the addition of higher BE components at 786 eV and 799 eV. These peaks likely represent interface molecules that have been "oxidized" by electron transfer to the Pt substrate, while the dominant peaks correspond to neutral $CoCp_2$ molecules in the bulk of the film. These Co peaks and associated shifts serve as useful markers to understand the spectra of the doped THAP films. In these spectra (FIGS. 5B-5D), the overall intensity of the Co 2p peaks decreases as the concentration of cobaltocene exposure is reduced, and the dominant unoxidized Co components shift toward the oxidized positions observed above. This transition occurs as the concentration of donor $CoCp_2$ molecules decreases and the fraction of ionized dopants increases.

XPS measurements on the undoped THAP sample simply exposed to a partial pressure of $CoCp_2$ (FIG. 5H) indicates the presence of a non-negligible amount of Co adsorbed onto the film surface. By comparing this Co peak intensity to that obtained from the "heavily" doped film (FIG. 5B), more than half the observed intensity in the doped film comes from surface-adsorbed cobaltocene. The problem is more prominent in more lightly doped samples, with nearly all of the cobalt intensity observed in the moderately and lightly doped THAP samples resulting from the surface contribution. Using XPS to rigorously quantify the doping concentration incorporated into the bulk film by subtracting the surface component may be difficult because the spectroscopic contributions of surface dopants relative to that of the bulk dopants decreases with increasing doping concentration. The entire cobalt signal in an undoped film is due to surface-adsorbed cobaltocene, whereas the proportion of surface to bulk cobaltocene in heavily doped films will be very small. Since the surface contribution of the Co signal is strongly correlated with the doping concentration, correction for this signal by assuming a constant surface component will overcorrect for highly doped samples and undercorrect for lightly doped samples.

The interface-doped THAP sample appears at first to exhibit some evidence of dopant diffusion since detectable amounts of Co are present at the surface (FIG. 5E). However, the intensity of the Co signal is comparable with that found for surface-exposed undoped THAP samples. After 30 minutes of annealing at 50° C., no appreciable change is observed in the XPS spectra. Furthermore, the peak intensity decreases after an additional hour of annealing at 60° C., suggesting that physisorbed cobaltocene may be driven off the surface in the process. Therefore, it is unlikely that appreciable cobaltocene diffusion occurs in THAP films.

To resolve the questions regarding doping concentration and diffusion raised by presence of surface-adsorbed $CoCp_2$, RBS data are obtained for (a) undoped, (b) lightly doped ($10^{-9}$ Torr), (c) highly doped ($10^{-7}$ Torr), and (d) interface-doped ($p_d$=$10^{-7}$ Torr for 30 nm) THAP films (FIG. 6). Since the Co signal is expected to appear at higher channel numbers, i.e. at higher kinetic energies—due to its larger atomic mass as compared to the other elements present in the matrix (H, C, N, F, and S)—that part of the RBS spectra is magnified in the inset of FIG. 6. By fitting the data to theoretical models and iteratively adjusting the elemental concentrations (Lüth, Surfaces and Interfaces of Solid Materials, 3rd Ed., Springer: New York, 1998, pp 215-226), the film composition vs. depth can be determined and is shown in Table 4. The highly doped sample shows a uniformly distributed 0.27 at % concentration of Co, which corresponds to nearly 30 mol % doping. This is in good agreement with the data observed by XPS, which indicated 38% doping when uncorrected for the surface contribution of cobaltocene. In the THAP sample grown under a low partial pressure of $CoCp_2$, no significant concentration of Co is detected, which is in agreement with the fact that the intensity of the XPS Co 2p peak of the lightly doped sample is comparable to that of the surface-exposed undoped sample. Indeed, estimations based solely on the growth parameters of the lightly-doped THAP samples would suggest a doping concentration of only 1%, which is below the detection limit of both XPS and RBS for their specific systems. However, other evidence of doping, such as the pronounced shift in EF and significant improvement in device performance, indicates that low doping concentrations are attainable.

TABLE 4

Atomic concentration (at %) of various elements present in different films as determined by modeling of the RBS data. The lightly doped THAP film was deposited under a cobaltocene partial pressure of $p_d$ = $10^{-9}$ Torr, while the highly doped films indicate a partial pressure of pd = $10^{-7}$ Torr. The interface-doped THAP film has a 30 nm-thick highly doped region near the bottom interface and pure THAP above.

| | Concentration (at %) | | | | | |
|---|---|---|---|---|---|---|
| | | Lightly | Highly | Interface doped THAP | | Highly doped |
| Element | Undoped THAP | doped THAP | doped THAP | <30 nm | >30 nm | Alq3 |
| Co | 0.0 | 0.0 | 0.27 | 0.25 | 0.0 | 0.0 |
| C | 56.3 | 54.3 | 53.53 | 55.05 | 55.3 | 52.0 |
| H | 0.0 | 0.0 | 0.27 | 0.25 | 0.0 | 33.0 |
| N | 7.0 | 7.0 | 7.00 | 7.00 | 7.0 | 5.0 |

TABLE 4-continued

Atomic concentration (at %) of various elements present in different films as determined by modeling of the RBS data. The lightly doped THAP film was deposited under a cobaltocene partial pressure of $p_d = 10^{-9}$ Torr, while the highly doped films indicate a partial pressure of pd = $10^{-7}$ Torr. The interface-doped THAP film has a 30 nm-thick highly doped region near the bottom interface and pure THAP above.

| | Concentration (at %) | | | | | |
|---|---|---|---|---|---|---|
| Element | Undoped THAP | Lightly doped THAP | Highly doped THAP | Interface doped THAP <30 nm | >30 nm | Highly doped Alq$_3$ |
| S | 2.7 | 2.7 | 2.70 | 2.70 | 2.7 | — |
| F | 22.0 | 22.0 | 21.50 | 22.00 | 22.0 | — |
| Al | — | — | — | — | — | 2.0 |
| O | — | — | — | — | — | 8.0 |

With regards to diffusion, interpretation of the RBS spectra for the interface-doped sample shows no discernable concentrations of cobaltocene in the THAP film beyond the intentionally doped region confined to 30 nm at the interface. Table 4 summarizes the elemental concentrations found in the doped (<30 nm) and undoped (>30 nm) regions of the film, and FIG. 7 illustrates the relative concentrations of Co, N, S, F, and C as a function film depth. The depth profiling of the film shows uniform concentration of the elements related to THAP, and a sharp, well-defined region at the organic-Si (100) interface with a finite concentration of cobaltocene. The spatial confinement of cobalt to the established region indicates that minimal diffusion of cobaltocene occurs in the THAP matrix.

Alq3 is an electron-transport material of great interest in organic optoelectronics. However, its EA (2.0 eV) is significantly lower than that of THAP, making n-doping considerably more challenging. Despite the energy misalignment between the Alq$_3$ LUMO and cobaltocene HOMO (FIG. 4), the incorporation of cobaltocene in Alq$_3$ was investigated with the possibility that a sufficiently large dopant density might result in measurable n-doping of the host (Wang et al. (2006) Chem. Phys. Lett., 423:170).

The UPS spectra of (a) undoped Alq$_3$ and (b) Alq$_3$ deposited under $10^{-7}$ Torr of cobaltocene are shown in FIG. 8. A 0.2 eV shift of the spectrum toward higher binding energy, which is equivalent to an upward shift of the Fermi level in the gap, is observed in the doped spectrum and suggests some n-doping effect. Furthermore, I-V characteristics (inset of FIG. 8) measured on Al/(200 nm)Alq$_3$/Al diodes fabricated using (a) undoped, (b) uniformly doped ($p_d=10^{-7}$ Torr), and (c) interface-doped Alq$_3$ show an increase in the current of the doped devices by a factor of 10. This magnitude of the $E_F$ shift and the increase in current are less than the improvements observed for CoCp$_2$-doped THAP. Additionally, the I-V characteristics of the uniformly doped and interface-doped devices (FIGS. 8(b) and (c) in the inset) are identical over six orders of magnitude.

The relative atomic concentrations in a 100 nm uniformly doped Alq$_3$ film ($p_d=10^{-7}$ Torr) as determined by the analysis of the RBS spectrum is summarized in the last column of Table 4. The RBS data clearly shows that any cobaltocene present in the film is below the detection limit of the experiment. This observation is confirmed by XPS, which does not indicate any significant Co intensity. Interestingly, and unlike the case of doping THAP, no surface adsorption of cobaltocene is detected. Since both RBS and XPS data show that cobaltocene does not incorporate significantly into the Alq$_3$ film, nor adsorb appreciably onto the surface of the film, it is therefore likely that most of the improvements in the I-V characteristics of the "doped" films results from modification of the interface energy level alignment during deposition of Alq$_3$ in a background pressure of cobaltocene. Indeed, simple exposure of a pristine Al substrate to cobaltocene reduces its work function by 0.3 eV, which is comparable to the energy level shifts observed between doped and undoped Alq$_3$. The effect, in this case, is therefore purely one of electrode-modification.

The different levels of CoCp$_2$ incorporation in THAP and Alq$_3$ can be explained as follows. The volatility of the CoCp$_2$ molecule, which enables the type of vacuum delivery described above, may be an impediment to the incorporation in the host matrix. In the case of THAP, the data suggest that incorporation occurs as a gas phase molecule hits the surface of the host film and transfers an electron to a THAP molecule. The resulting ionized dopants are stabilized by Coulomb interaction with the doped THAP molecules on the film surface and are incorporated, whereas the neutral molecules are not, because of insufficient interaction with the surface. As charge transfer is not energetically favorable with Alq$_3$, the CoCp$_2$ molecules do not stick to the surface and are not incorporated in the growing film.

A number of publications and patent documents are cited throughout the foregoing specification in order to describe the state of the art to which this invention pertains. The entire disclosure of each of these citations is incorporated by reference herein.

While certain of the preferred embodiments of the present invention have been described and specifically exemplified above, it is not intended that the invention be limited to such embodiments. Various modifications may be made thereto without departing from the scope and spirit of the present invention, as set forth in the following claims.

What is claimed is:

1. An n-doped conductive material comprising an organic electron transporting material and at least one organometallic dopant cation compound bearing a full or partial positive charge, wherein the free energy change associated with electron transfer from said organometallic compound to said organic electron transporting material is less than +0.3 eV and wherein said organic electron transporting material is not an allotrope of carbon.

2. The conductive material of claim 1, wherein said free energy change is less than or equal to zero eV.

3. The conductive material of claim 1, wherein said organometallic compound has a formula selected from the group consisting of Formulas I-X

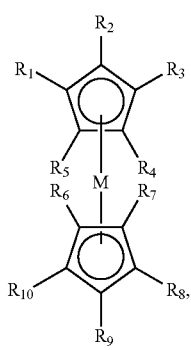

I

23
-continued
II
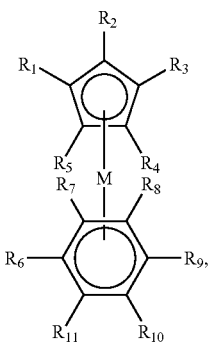
III
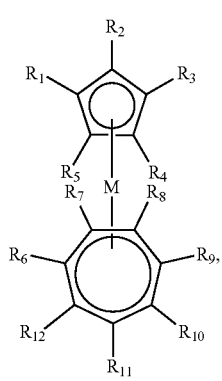
IV
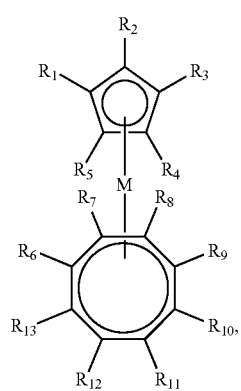
V
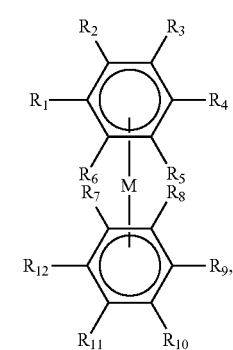
24
-continued
VI
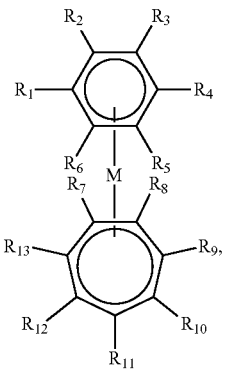
VII
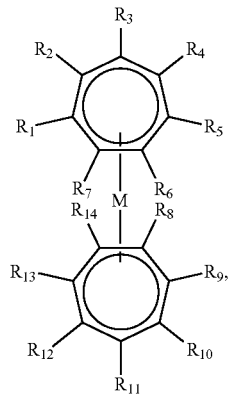
VIII
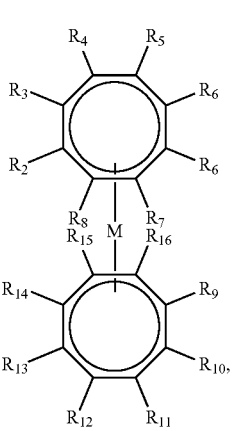
IX
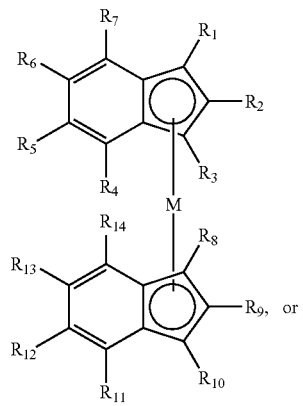
or -continued

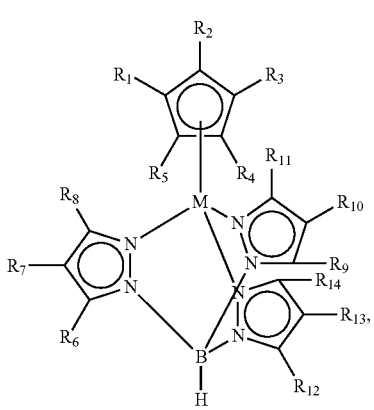

X wherein $R_1$-$R_{16}$ are independently selected from the group consisting of hydrogen, alkyl, aryl, benzyl, halides, alkoxy, and amino groups, and wherein M is a transition, lanthanide, or actinide metal.

4. The conductive material of claim 1, wherein said organometallic compound is selected from, the group consisting of cobaltocene, $Co(C_5Me_5)_2$, and $Fe(C_5Me_5)(C_6Me_6)$.

5. The conductive material of claim 1, wherein said organometallic compound is cobaltocene.

6. The conductive material of claim 1, wherein said organic electron transporting material is selected from the group consisting of perylene diimides, hexazatrinaphthylene derivatives, oxadiazole derivatives, polyphenylenevinylenes, bis-dioxaborines, and siloles.

7. The conductive material of claim 6, wherein said organic electron transporting material is tris{2,5-bis(3,4-bis-trifluoromethyl-phenyl)thieno}[3,4-b,h,n]-1,4,5,8,9,-12-hexazatriphenylene (THAP).

8. The conductive material of claim 1 which is a film.

9. An electronic device comprising the conductive material of claim 1.

10. The conductive material of claim 1 wherein said organic electron transporting material comprises an electroconductive polymer or oligomer, alone or in combination.

11. The conductive material of claim 1, wherein said organometallic compound has the formula

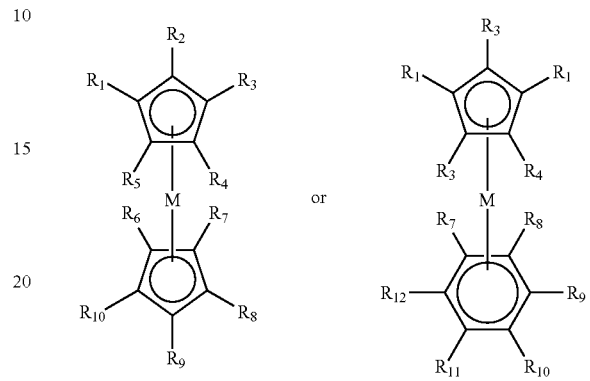

wherein $R_1$-$R_{10}$ are independently selected from the group consisting of hydrogen, alkyl, aryl, benzyl, halides, alkoxy, and amino groups, and M is selected from transition metal elements.

12. The conductive material of claim 11, wherein $R_1$-$R_{10}$ are independently selected from the group consisting of hydrogen, or linear or branched alkyls having up to 25 carbon atoms.

13. The conductive material of claim 1, wherein the organic electron transporting material bears a full or partial negative charge.

* * * * *